(12) United States Patent
Wang et al.

(10) Patent No.: US 11,133,316 B2
(45) Date of Patent: Sep. 28, 2021

(54) SEMICONDUCTOR DEVICE HAVING A SERPENTINE SHAPE ISOLATION

(71) Applicant: Hexas Technology Corp., New Taipei (TW)

(72) Inventors: Chen-Chih Wang, New Taipei (TW); Yeu-Yang Wang, New Taipei (TW)

(73) Assignee: Hexas Technology Corp., New Taipei (TW)

( * ) Notice: Subject to any disclaimer, the term of this patent is extended or adjusted under 35 U.S.C. 154(b) by 0 days.

(21) Appl. No.: 16/777,857

(22) Filed: Jan. 30, 2020

(65) Prior Publication Data

US 2020/0303380 A1 Sep. 24, 2020

Related U.S. Application Data

(60) Provisional application No. 62/819,687, filed on Mar. 18, 2019.

(30) Foreign Application Priority Data

Dec. 6, 2019 (TW) .................................. 108144787

(51) Int. Cl.
*H01L 29/786* (2006.01)
*H01L 27/108* (2006.01)
*H01L 21/8234* (2006.01)

(52) U.S. Cl.
CPC ................. *H01L 27/10823* (2013.01); *H01L 21/823437* (2013.01); *H01L 21/823462* (2013.01); *H01L 27/10861* (2013.01)

(58) Field of Classification Search
CPC ......... H01L 29/66272; H01L 29/66666; H01L 29/78642; H01L 29/7889; H01L 29/7926; H01L 27/10852; H01L 27/10876
See application file for complete search history.

(56) References Cited

U.S. PATENT DOCUMENTS

| 7,098,478 | B2 * | 8/2006 | Takaura .............. H01L 27/0688 257/302 |
|---|---|---|---|
| 2005/0245029 | A1 | 11/2005 | Choi et al. |
| 2005/0285183 | A1 | 12/2005 | Baik |
| 2007/0026651 | A1 | 2/2007 | Leam et al. |
| 2007/0029628 | A1 | 2/2007 | Kang et al. |
| 2011/0070706 | A1 | 3/2011 | Kim et al. |

* cited by examiner

*Primary Examiner* — Hoai V Pham
(74) *Attorney, Agent, or Firm* — CKC & Partners Co., LLC

(57) ABSTRACT

The disclosure provides a semiconductor device and a fabrication method thereof. The semiconductor device includes a substrate, a first and a second polysilicon layers on the substrate, a third polysilicon layer between the first and the second polysilicon layers, a first isolation layer adjacent with the first to the third polysilicon layers, a gate dielectric layer and a gate conductive layer in the third polysilicon layer, a second isolation layer on the gate conductive layer and the third polysilicon layer, a third isolation layer on the first the second isolation layers, a bit line via contact through the first and the third isolation layers, and a conductive layer on the bit line via contact and the third isolation layer. The third polysilicon layer has a concave portion between the first and the second polysilicon layers.

12 Claims, 31 Drawing Sheets

SEMICONDUCTOR DEVICE HAVING A SERPENTINE SHAPE ISOLATION

RELATED APPLICATIONS

This application claims priority to U.S. Provisional Application Ser. No. 62/819,687, filed Mar. 18, 2019, and Taiwan Application Serial Number 108144787, filed Dec. 6, 2019, the disclosure of which are incorporated herein by reference in their entireties.

BACKGROUND

Technical Field

The present disclosure relates to a semiconductor device and a fabrication method thereof.

Description of Related Art

Semiconductor memory devices may be classified into two categories, volatile memory devices and nonvolatile memory devices. The volatile memory cells, such as dynamic random access memory (DRAM) cells, may include a transistor and a capacitor (1T1C). The capacitor can either be charged or discharged; these two states are taken to represent the two values of a bit, called 0 and 1. The transistor may include a channel region between a pair of source/drain regions and a gate configured to electrically connect the source/drain regions to one another through the channel region.

SUMMARY

According to some embodiments of the present disclosure, a method of forming a semiconductor device includes following steps. A stack of the first polysilicon layer, a silicon nitride layer, and a second polysilicon layer are formed. A first trench penetrating the stack is formed, wherein the first trench has a serpentine shape, in a top view. A first isolation in the first trench is filled. A second trench penetrating the stack is formed to expose sidewalls of the first polysilicon layer, the silicon nitride layer, and the second polysilicon layer. The silicon nitride layer is removed to form a recess between the first polysilicon layer and the second polysilicon layer. Exposed sidewalls of the first polysilicon layer and the second polysilicon layer are doped to define a source terminal contact and a drain terminal contact. A third polysilicon layer is formed on the first polysilicon layer, the second polysilicon layer and in the recess between the first polysilicon layer and the second polysilicon layer, such that the third polysilicon layer has a concave portion between the first polysilicon layer and the second polysilicon layer. The concave portion is doped to define a source region and a drain region. An inside of the concave portion is doped to form a well region, and the well region serves as a bulk. The bulk faces toward the first trench. The concave portion is doped to define a channel region, and the concave portion is defined as a main body of a memory device. A gate dielectric layer is formed on the third polysilicon layer. A gate conductive layer is formed on the gate dielectric layer, and the gate conductive layer is defined as a word line. The gate conductive layer in the recess serves as a gate which faces toward the second trench. A second isolation layer is formed on the gate conductive layer.

According to some embodiments of the present disclosure, the method further includes following steps. A third isolation layer is formed on the stack. A bit line via contact is formed through the first isolation layer and the third isolation layer. A conductive layer is formed on the bit line via contact, and the conductive layer is defined as a bit line.

According to some embodiments of the present disclosure, the method further includes following steps. A fourth isolation layer is formed on the conductive layer. A capacitor landing pad through the fourth isolation layer, the conductive layer, and the third isolation layer.

According to some embodiments of the present disclosure, the method further includes following steps. A fifth isolation is formed on the capacitor landing pad and the fourth isolation layer. A bottom electrode plate, a high-k dielectric layer, and a top electrode plate are formed in sequence in the fifth isolation layer.

According to some embodiments of the present disclosure, a length direction of the second isolation layer is parallel to a length direction of the first isolation layer.

According to some embodiments of the present disclosure, the third polysilicon layer further has a first portion and a second portion connected to the concave portion, the first portion and the second portion are respectively on the first polysilicon layer and the second polysilicon layer.

According to some embodiments of the present disclosure, the method further includes etching the gate conductive layer, the gate dielectric layer, and a portion of the third polysilicon layer on the first polysilicon layer and the second polysilicon layer to form a third trench before the second isolation layer is formed on the gate conductive layer.

According to some embodiments of the present disclosure, the method further includes etching the first isolation layer to leave a portion of the remaining first isolation layer before forming the bit line via contact through the third isolation layer and the first isolation layer.

According to some embodiments of the present disclosure, a semiconductor device includes a substrate, a first isolation layer, a second polysilicon layer, a third polysilicon layer, a first isolation layer, a gate dielectric layer, a gate conductive layer, a second isolation layer, a third isolation layer, a bit line via contact, and a conductive layer. The first polysilicon layer and a second polysilicon layer are disposed on the substrate. The third polysilicon layer is disposed between the first polysilicon layer and the second polysilicon layer. The third polysilicon layer has a concave portion. The concave portion is disposed between the first polysilicon layer and the second polysilicon layer, and the concave portion is defined as a main body of a memory device. The main body includes a bulk. The first isolation layer is adjacent with the first isolation layer, the second isolation layer, and the third polysilicon layer. The first isolation layer has a serpentine shape, in a top view. The gate dielectric layer and the gate conductive layer are disposed in the third polysilicon layer, and the gate dielectric layer protrudes from the third polysilicon layer, wherein the gate conductive layer facing the concave portion serves as a gate. The second isolation layer is disposed on the gate conductive layer and the third polysilicon layer, wherein the bulk and the gate respectively faces toward the first isolation layer and the second isolation layer. The third isolation layer is disposed on the first isolation layer and the second isolation layer. The bit line via contact is disposed through the first isolation layer, the second isolation layer, and the third isolation layer. The conductive layer is disposed on the bit line via contact and the third isolation layer, wherein the conductive layer is defined as a bit line.

According to some embodiments of the present disclosure, the semiconductor device further includes a capacitor landing pad, a bottom electrode plate, a high-k dielectric layer, and a top electrode plate. The capacitor landing pad is disposed through the third isolation layer. The bottom electrode plate, the high-k dielectric layer, and the top electrode plate are disposed in sequence over the capacitor landing pad. The bottom electrode plate, the high-k dielectric layer, and the top electrode plate are defined as a capacitor.

According to some embodiments of the present disclosure, the semiconductor device further includes a fourth isolation layer on the conductive layer. The capacitor landing pad is disposed through the third isolation layer and the fourth isolation layer.

According to some embodiments of the present disclosure, the semiconductor device further includes a fifth isolation layer on the fourth isolation layer and the capacitor landing pad.

According to some embodiments of the present disclosure, the bottom electrode plate, the high-k dielectric layer, the top electrode plate, the capacitor landing pad, a source terminal contact, a drain terminal contact, and the main body are defined as a DRAM cell, and an area density of the DRAM cell is less than six times a square of a feature size, per cell. The drain terminal contact and the source terminal contact are respectively disposed on sidewalls of the first polysilicon layer and the second polysilicon layer.

According to some embodiments of the present disclosure, the bottom electrode plate, the high-k dielectric layer, and the top electrode plate are formed embedded in the fifth isolation layer, and the capacitor is disposed over the conductive layer.

According to some embodiments of the present disclosure, the second isolation layer has a strip shape, and the main body of the memory device is arranged antisymmetrically, in the top view.

According to some embodiments of the present disclosure, the bottom electrode plate wraps around the high-k dielectric layer, and the high-k dielectric layer wraps around the top electrode plate.

According to some embodiments of the present disclosure, the bottom electrode plate is in contact with the capacitor landing pad.

According to some embodiments of the present disclosure, the third polysilicon layer covers the first polysilicon layer and the second polysilicon layer. The concave portion of the third polysilicon layer has a semi-elliptical profile, in the top view.

According to some embodiments of the present disclosure, a vertical projection region of the bit line via contact on the substrate is not overlapped with a vertical projection region of the capacitor landing pad on the substrate.

According to some embodiments of the present disclosure, the semiconductor device includes a polysilicon structure and a block structure on the substrate, and the polysilicon structure wraps the block structure.

In summary, the disclosure provides the semiconductor device and the fabrication method of the semiconductor device. By using the aforementioned semiconductor device, a density of the semiconductor device can be increased, thereby improving a performance of the semiconductor device.

It is to be understood that both the foregoing general description and the following detailed description are by examples, and are intended to provide further explanation of the invention as claimed.

BRIEF DESCRIPTION OF THE DRAWINGS

Embodiments of the present disclosure can be more fully understood by reading the following detailed description of the embodiment, with reference made to the accompanying drawings as follows.

DETAILED DESCRIPTION

Figure 1:
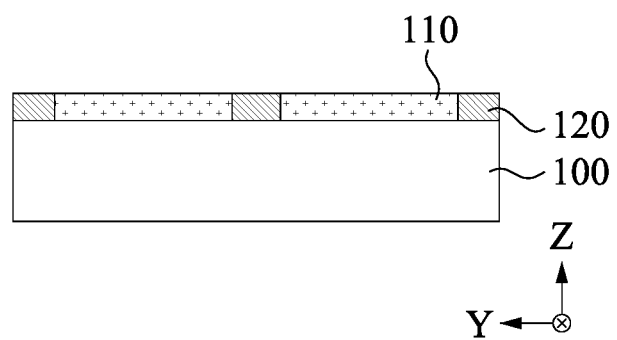
FIGS. 1, 2A, 3, 4A, 5A, 6A, 7, 8, 9A, 10, 11A, 12A, 13A, 14, 15, 16, 17, and 18A are cross-sectional views of various stages in the fabrication of a semiconductor device in accordance with some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1, 2A, 3, 4A, 5A, 6A, 7, 8, 9A, 10, 11A, 12A, 13A, 14, 15, 16, 17, and 18A are cross-sectional views of various stages in the fabrication of a semiconductor device in accordance with some embodiments of the present disclosure.

Referring to FIG. 1, a polysilicon structure 110 and a first block structure 120 are formed on the substrate 100. In some embodiments, the substrate 100 is a silicon substrate. In other embodiments, the substrate 100 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 100 is a SOI such as having a buried layer. In some embodiments, the first block structure 120 is made of silicon nitride.

Figure 2A:
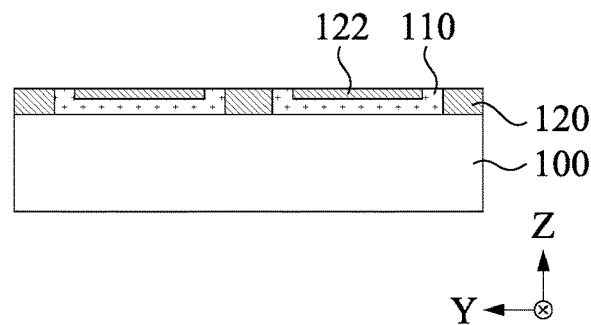
Figure 2B:
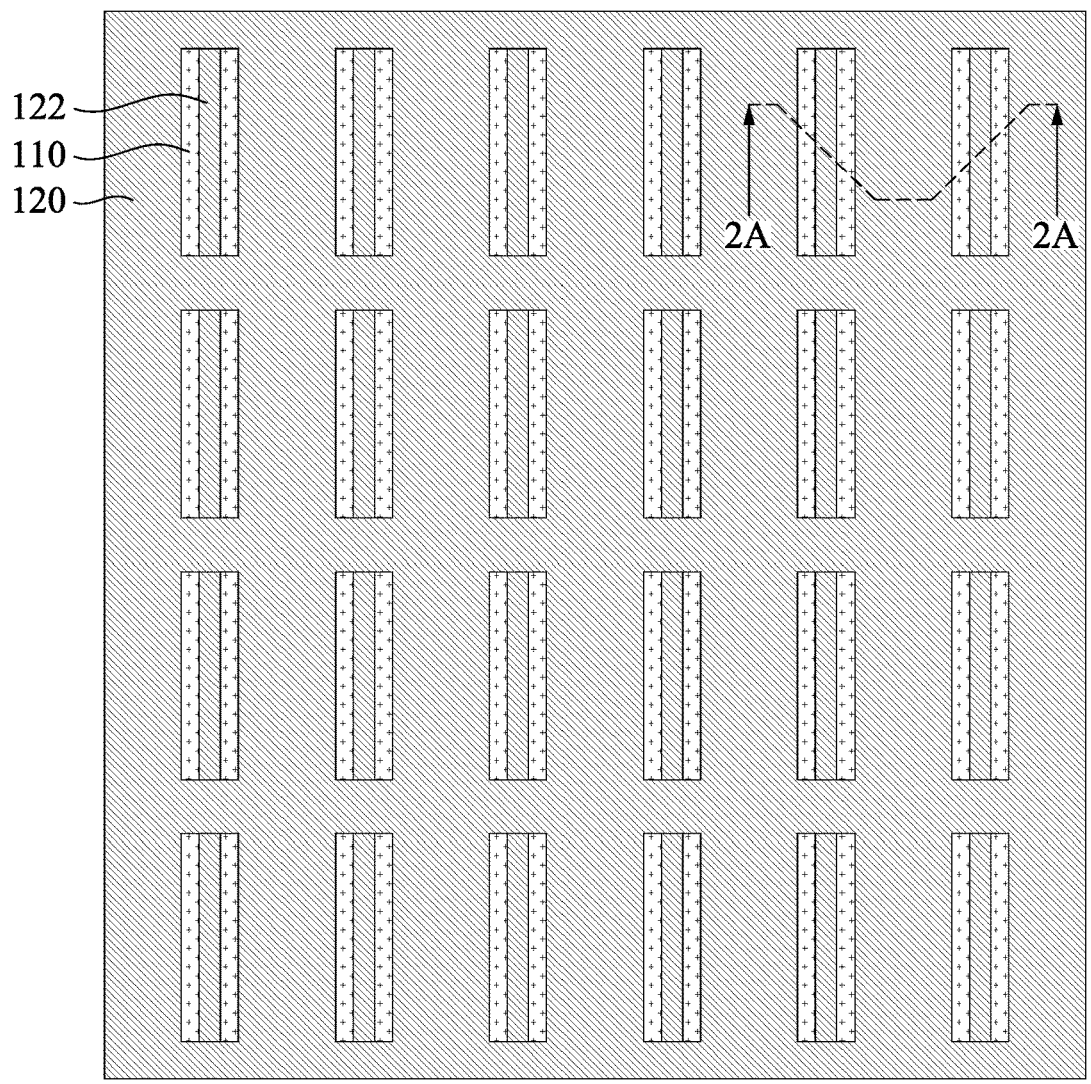
FIG. 2B is a top view of FIG. 2A.

Referring to FIGS. 2A and 2B, FIG. 2B is a top view of the semiconductor device shown in FIG. 2A. Stated differently, FIG. 2A is a cross-sectional view of the semiconductor device taken along line 2A-2A of FIG. 2B. A second block structure 122 is formed to be embedded in the polysilicon structure 110. In greater details, the method of forming the second block structure 122 may include forming a trench in the polysilicon structure 110 and then filling a block material in the trench. The polysilicon structure 110 wraps the second block structure 122, and the polysilicon structure 110 may serve as a bit line (BL) connection structure. In some embodiments, the second block structure 122 is made of the same material as the first block structure 120, such as silicon nitride.

Figure 3:
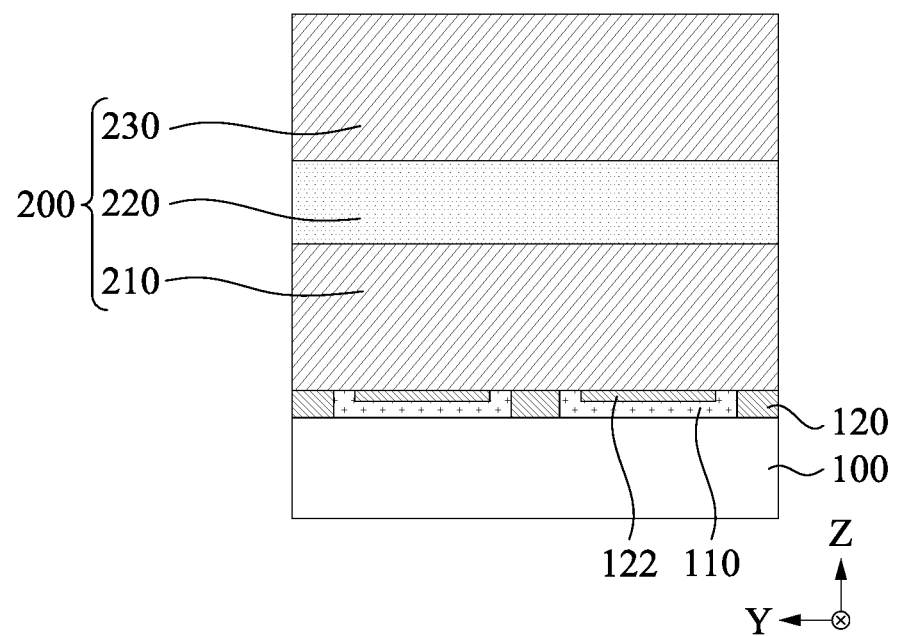

Referring to FIG. 3, a stack 200 is formed on the substrate 100. In greater details, the stack 200 includes a first polysilicon layer 210, a silicon nitride layer 220, and a second polysilicon layer 230. In other words, the first polysilicon layer 210, the silicon nitride layer 220 and the second polysilicon layer 230 are sequentially stacked on the substrate 100, and the first polysilicon layer 210 is the closest to the substrate 100 among the stack 200. The first polysilicon layer 210 is in contact with the polysilicon structure 110, the first block structure 120, and the second block structure 122.

Figure 4A:
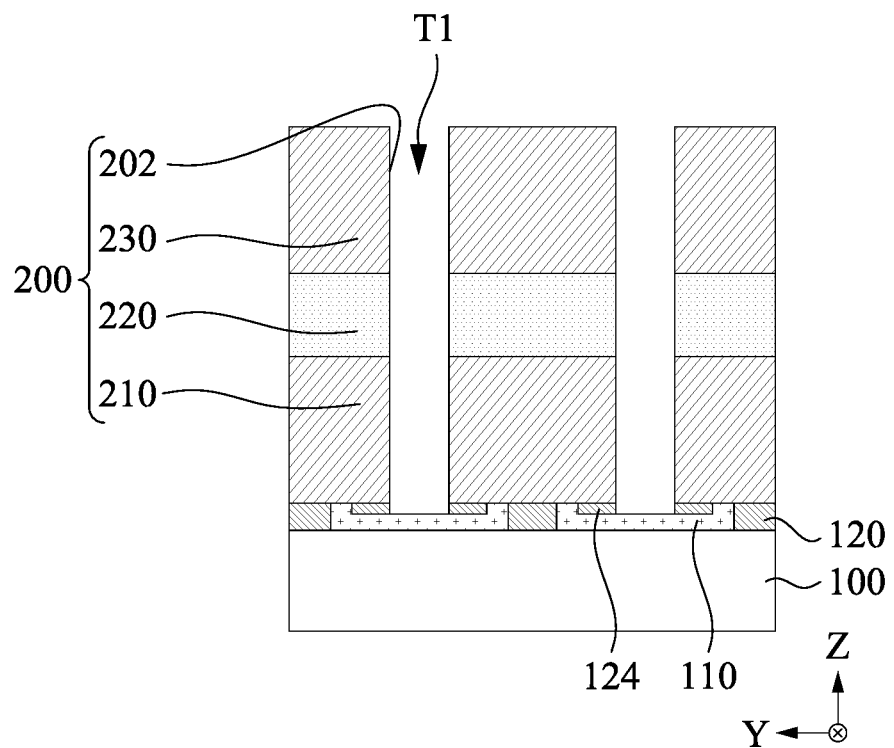
Figure 4B:
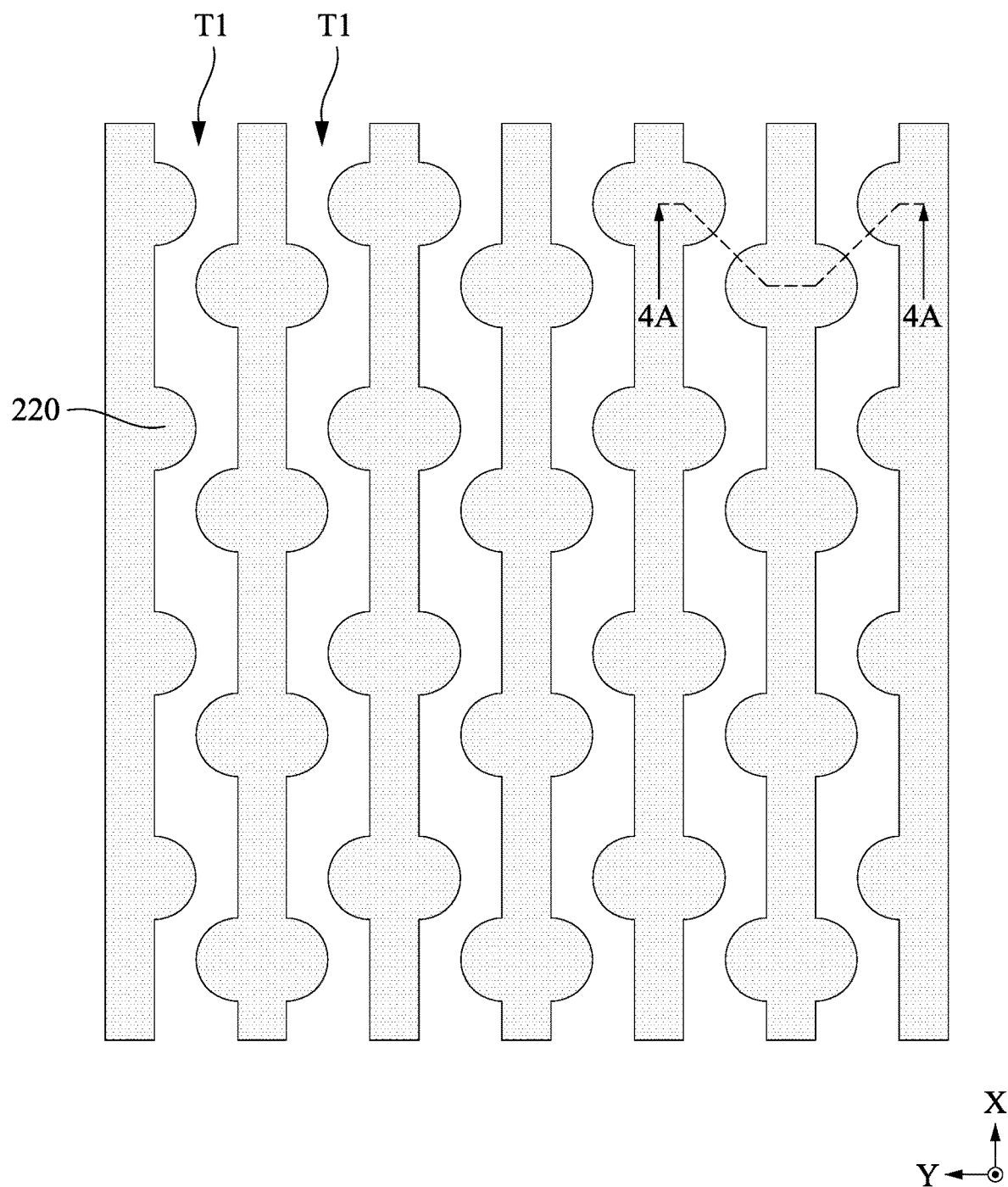
FIGS. 4B, 5B, and 6B are top views of the semiconductor device respectively shown in FIGS. 4A, 5A, and 6A, in which a second polysilicon layer is omitted for clarity.

Referring to FIG. 4A and FIG. 4B, FIG. 4B is a top view of the semiconductor device shown in FIG. 4A, in which the second polysilicon layer 230 is omitted for clarify. Stated differently, FIG. 4A is a cross-sectional view of the semiconductor device taken along line 4A-4A of FIG. 4B. After the stack 200 is formed, a portion of the stack 200 is etched to form a first trench T1 penetrating the stack 200. In greater details, a patterned hard mask layer may be formed on the stack 200 by a suitable deposition, developing, and/or etching technique, and the patterned hard mask layer may be used as an etch mask to etch the stack 200. The etching of the stack 200 terminates at the polysilicon structure 110. The first trench T1 exposes the underlying polysilicon structure 110. As a result, the first trench T1 is formed such that a portion of the second block structure 122 is removed to form the third block structure 124. The third block structure 124 extends from a sidewall 202 of the stack 200 and faces toward the trench T1. As shown in FIG. 4A, the polysilicon structure 110 and the third block structure 124 are disposed on the substrate 100, and the polysilicon structure 110 wraps the third block structure 124. In other words, the polysilicon structure 110 is in contact with the first block structure 120 and the third block structure 124. A bottom surface of the polysilicon structure 110 is below a bottom surface of the third block structure 124. In some embodiments, the first trench T1 has a serpentine shape, as shown in FIG. 4B. In greater details, the first trench T1 has an S-shaped profile in the top view (FIG. 4B). In some embodiments, a sidewall of the third block structure 124 is aligned with the sidewall 202 of the stack 200. In other words, the sidewall of the third block structure 124 is aligned to the sidewalls of the first polysilicon layer 210, the silicon nitride layer 220, and the second polysilicon layer 230.

In some embodiments, an end point detection technique may be used in determining stopping of the stack 200 during the etching process. The etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2O$ (APM), $NH_2OH$, KOH, $HNO_3:NH_4F:H_2O$, and/or the like.

Figure 4C:
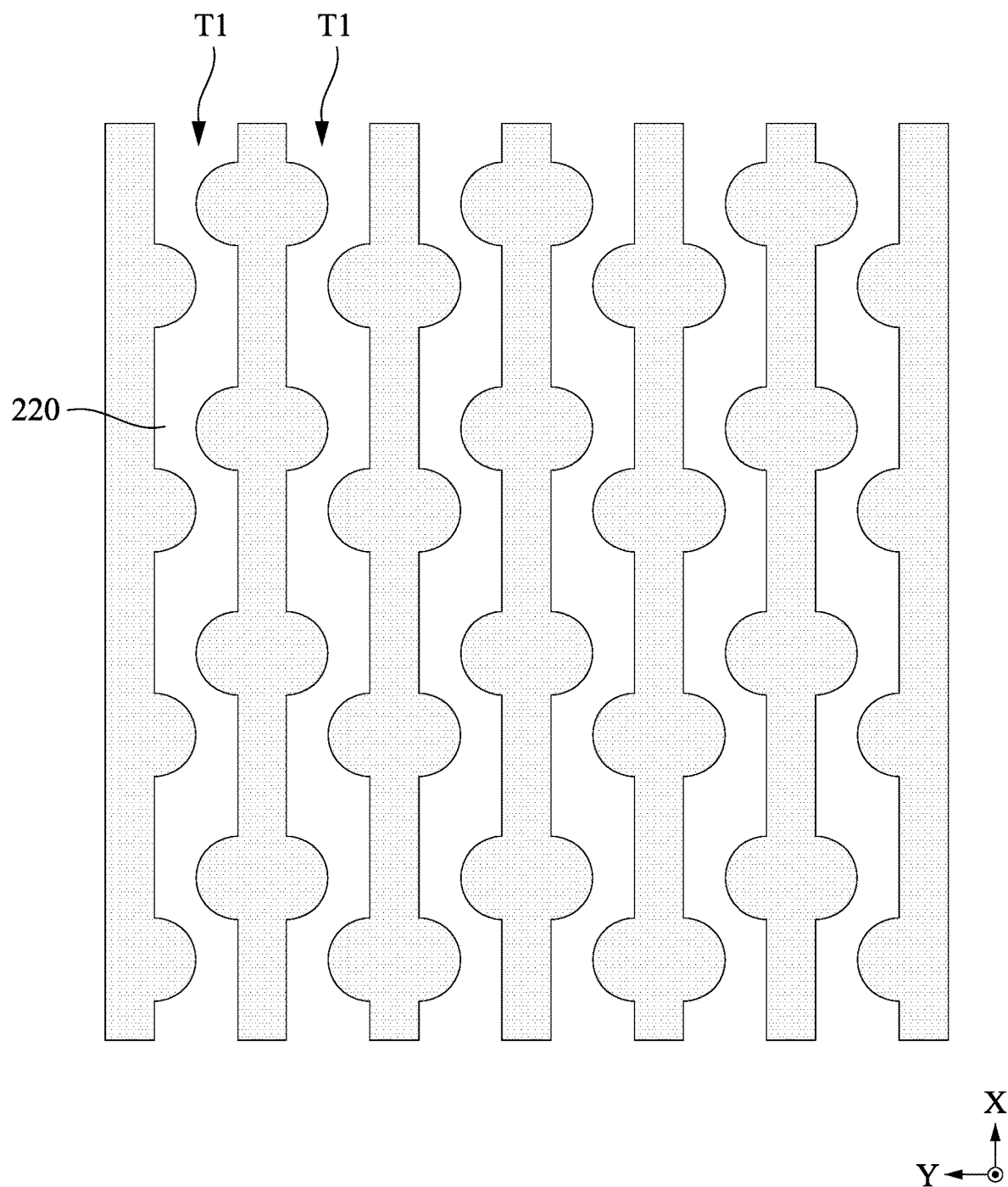
FIGS. 4C, 4D and 4E illustrate different embodiments of a first trench in FIG. 4B.
Figure 4D:
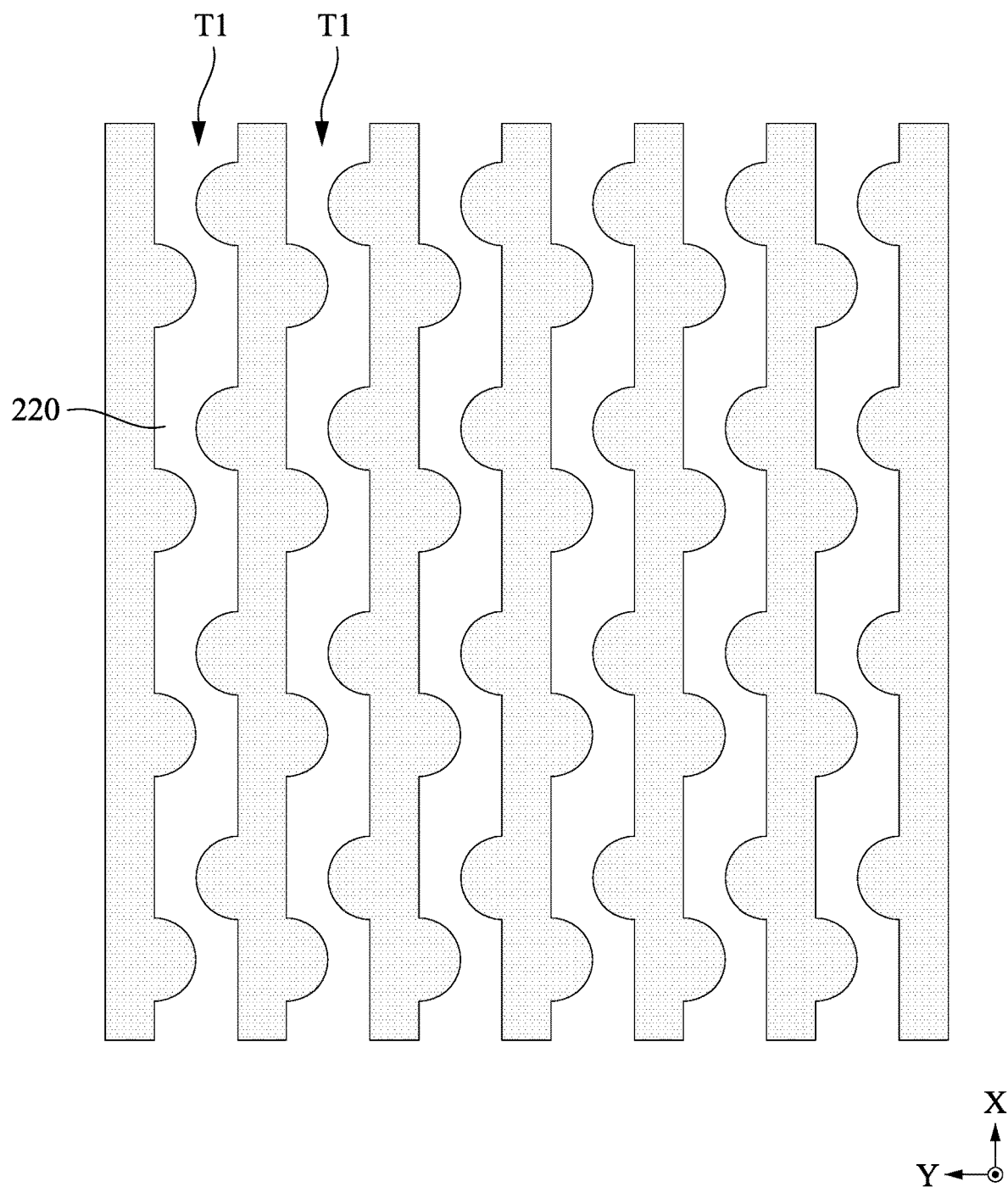
Figure 4E:
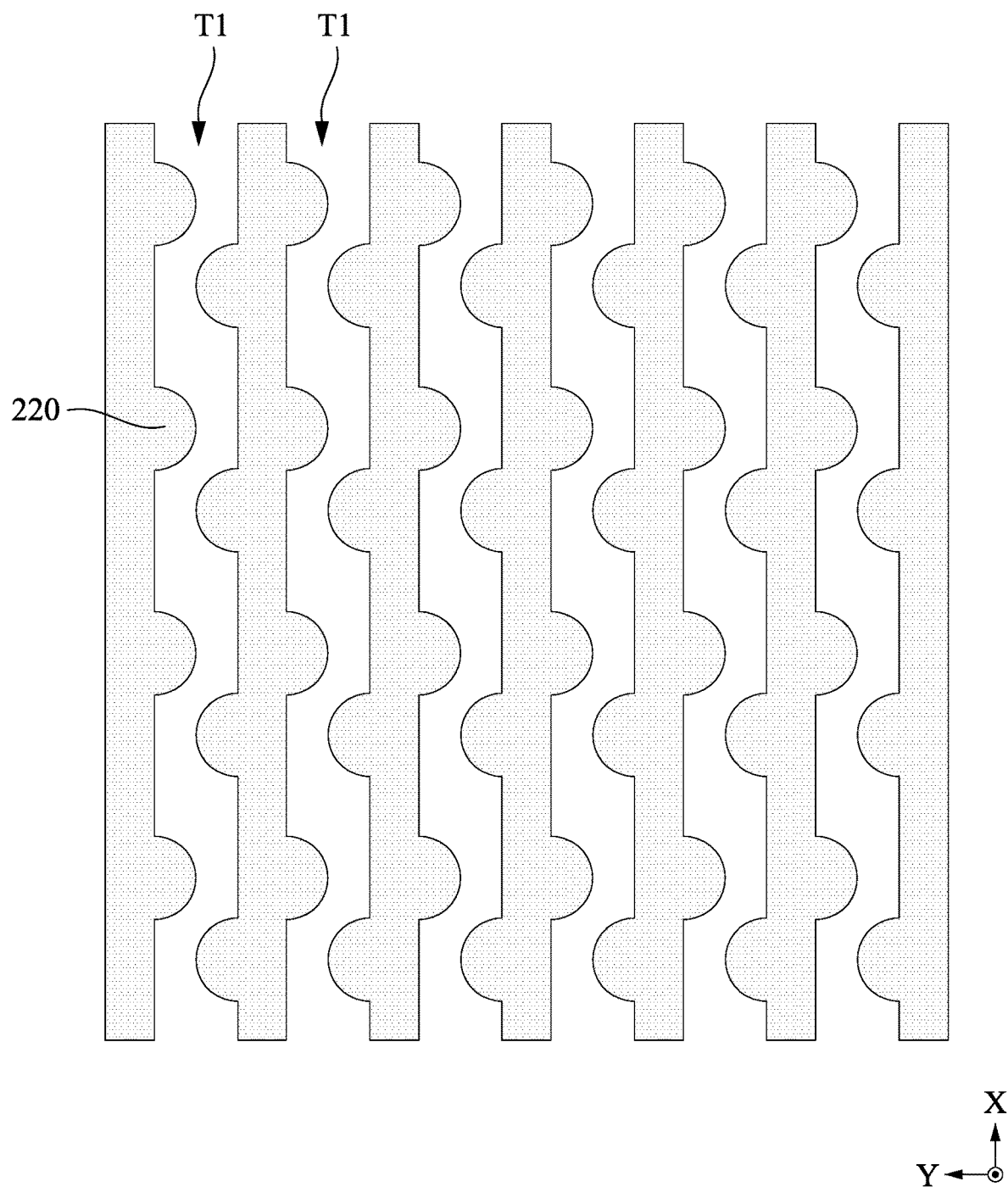

FIGS. 4C, 4D and 4E illustrate different embodiments of the first trench T1 in FIG. 4B. One of the first trenches T1 in FIG. 4B is arranged antisymmetrically with another adjacent first trench T1. In greater details, as shown in FIG. 4B, one of the first trenches T1 (e.g., the first trench T1 on the left side) has an inverse S-shaped profile, and another adjacent first trench T1 (e.g., the first trench T1 on the right side) has an S-shaped profile. One of the first trenches T1 in FIG. 4C is arranged antisymmetrically with another adjacent first trench T1. In greater details, as shown in FIG. 4C, one of the first trenches T1 (e.g., the first trench T1 on the left side) has an S-shaped profile, and the other adjacent first trench T1 (e.g., the first trench T1 on the right side) has an inverse S-shaped profile. One of the first trenches T1 in FIG. 4D is arranged symmetrically with another adjacent first trench T1. In greater details, as shown in FIG. 4D, one of the first trenches T1 (e.g., the first trench T1 on the left side) has an S-shaped profile, and the other adjacent first trench T1 (e.g., the first trench T1 on the right side) has an inverse S-shaped profile. One of the first trenches T1 in FIG. 4E is symmetrically arranged with another adjacent first trench T1. In greater details, as shown in FIG. 4E, one of the first trenches T1 (e.g., the first trench T1 on the left side) has an inverse S-shaped profile, and the other adjacent first trench T1 (e.g., the first trench T1 on the right side) has an S-shaped profile.

Figure 5A:
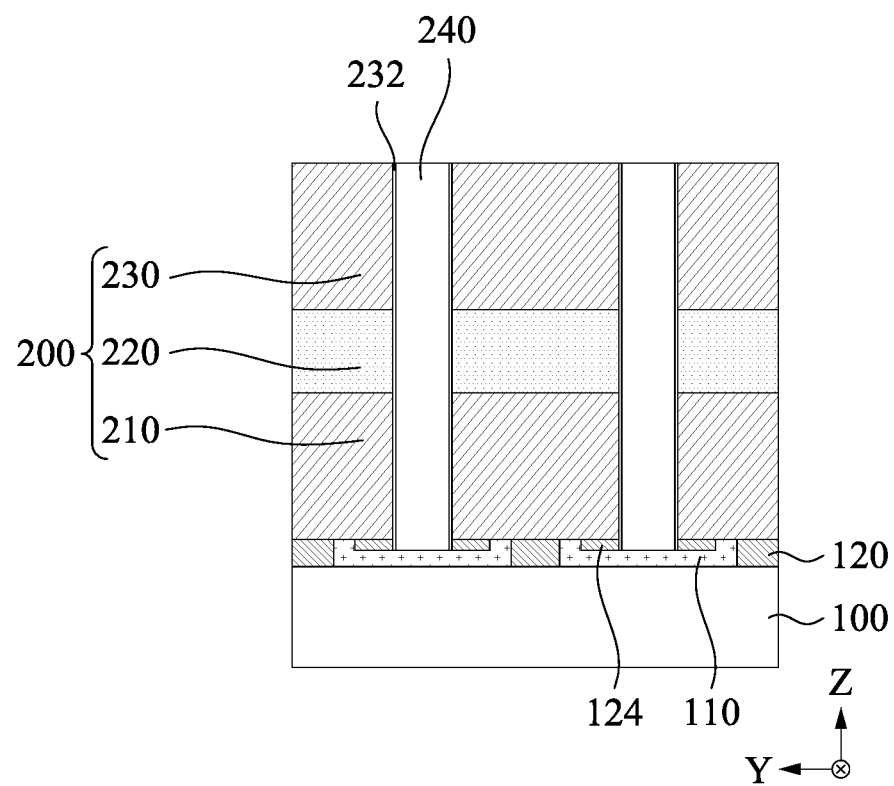
Figure 5B:
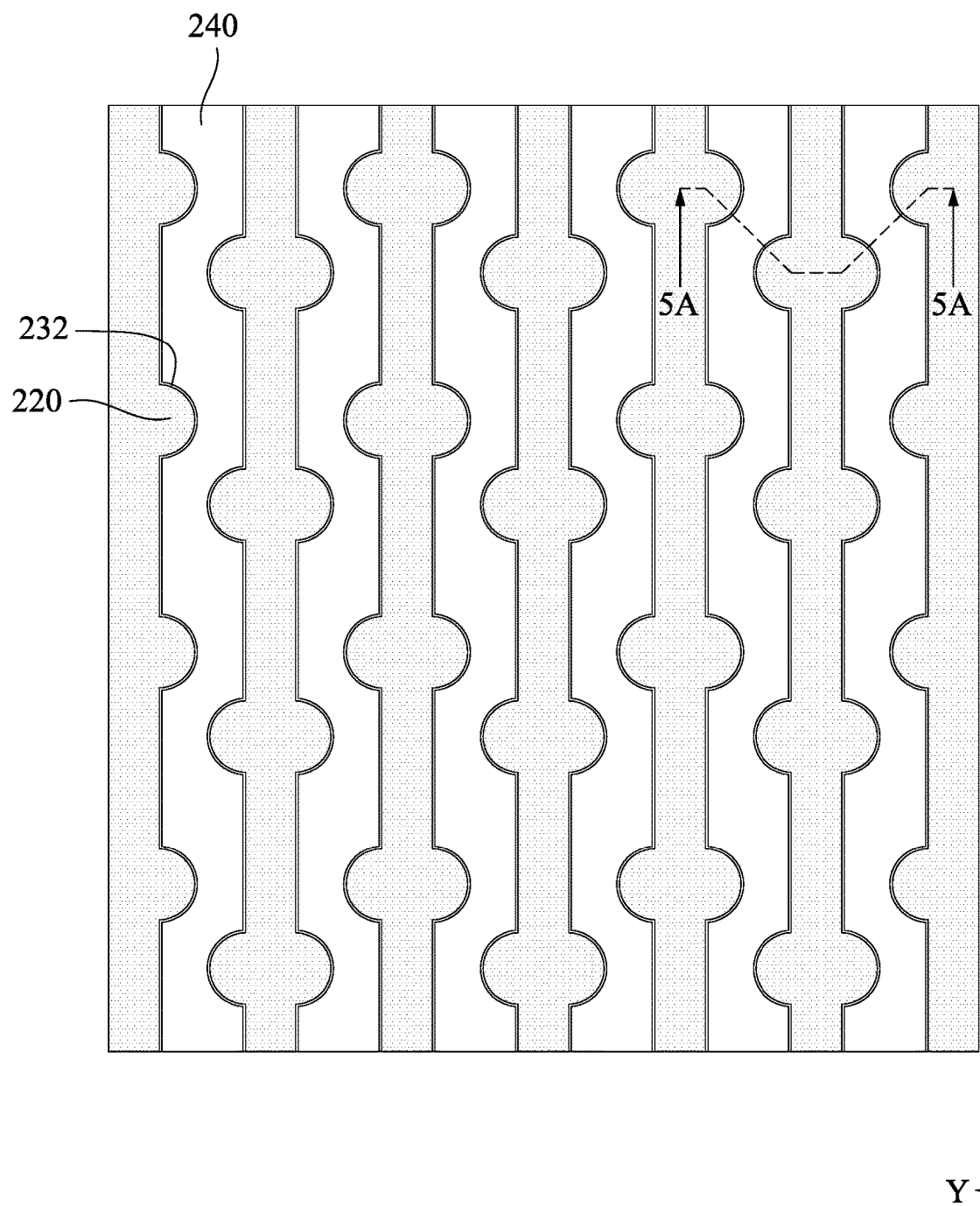

Referring to FIG. 5A and FIG. 5B, FIG. 5B is a top view of the semiconductor device shown in FIG. 5A, in which the second polysilicon layer 230 is omitted for clarify. Stated differently, FIG. 5A is a cross-sectional view of the semiconductor device taken along line 5A-5A of FIG. 5B. A liner layer 232 is formed on the exposed sidewall 202 (see FIG. 4A) of the stack 200. After the liner layer 232 is formed, the trench T1 (see FIG. 4A) is then filled with insulating materials to form a first isolation layer 240. In some embodiments, after the first isolation layer 240 is formed, a planarization process, such as a CMP process, may be performed to remove excess materials of the liner layer 232 and/or the first isolation layer 240. In some embodiments, the first isolation layer 240 includes silicon oxide layer, silicon nitride layer or silicon oxynitride layer, and the like. The first isolation layer 240 may be made of low-k dielectric material, such as tetraethoxysilane (TEOS). The first isolation layer 240 may be formed by CVD, PECVD, ALD, FCVD, LPCVD, or other suitable methods.

Figure 6A:
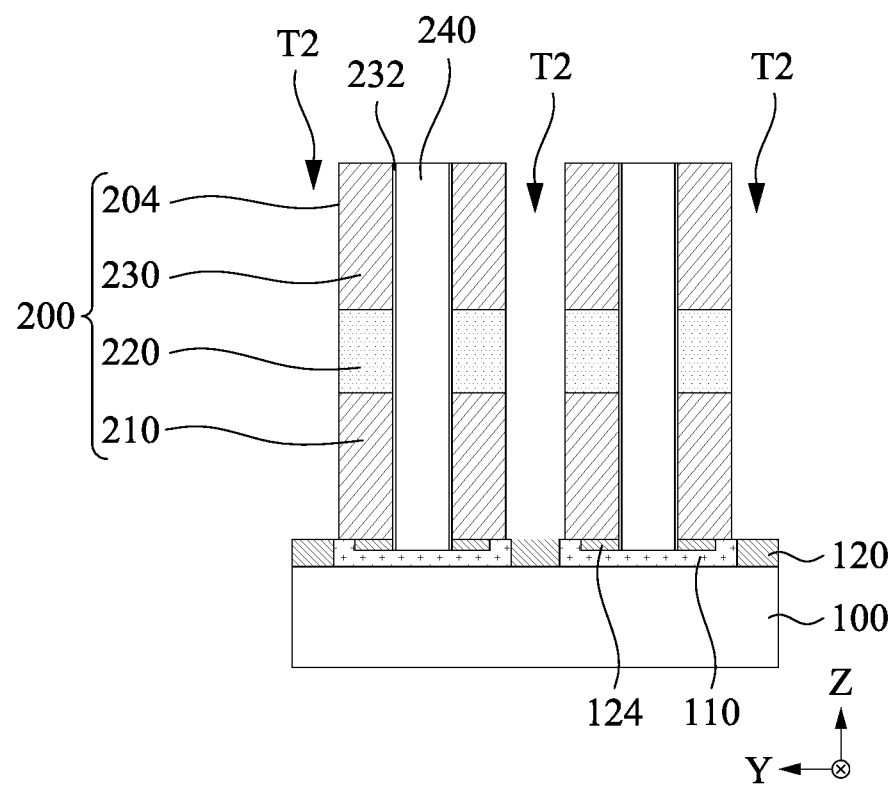
Figure 6B:
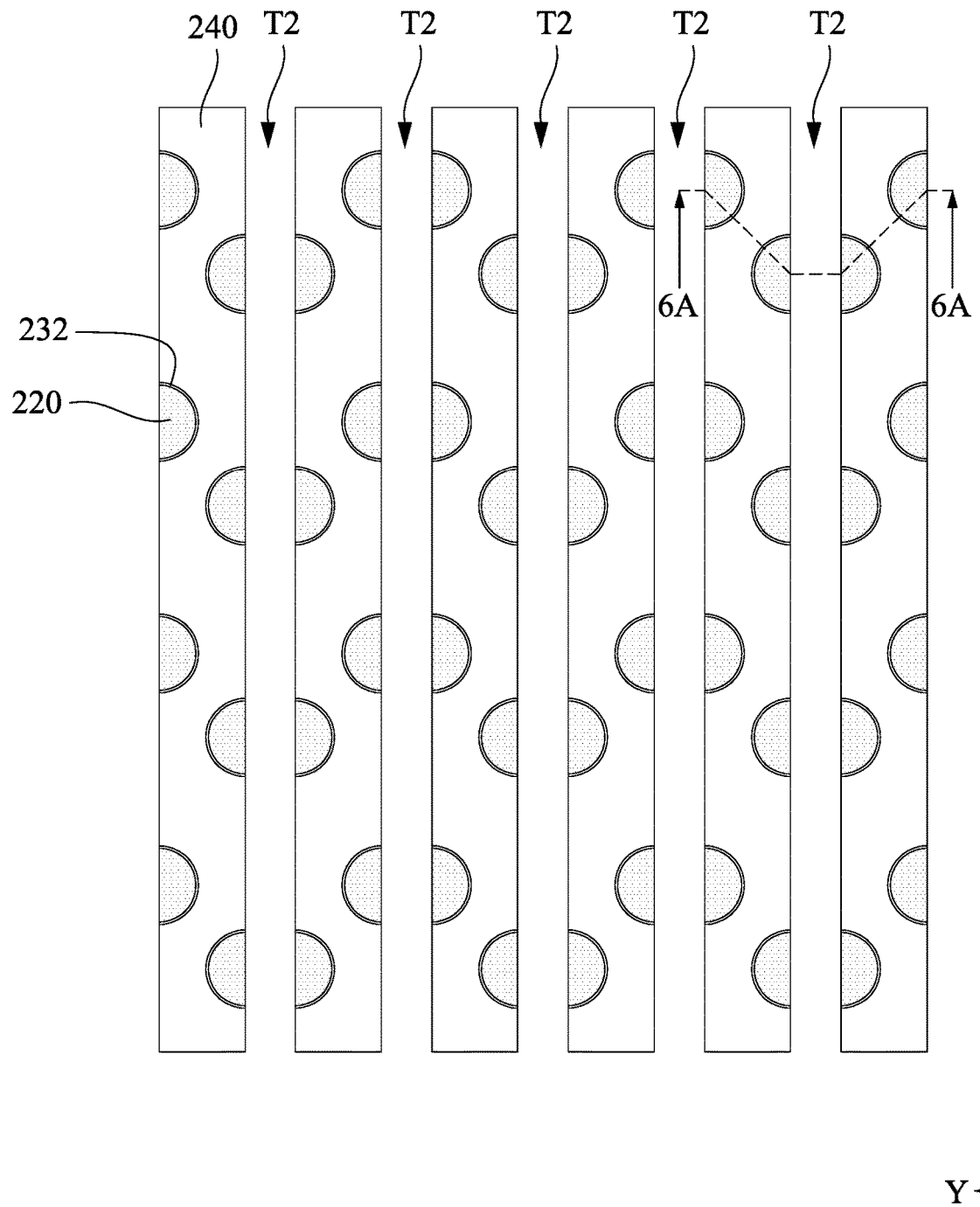

Referring to FIG. 6A and FIG. 6B, FIG. 6B is a top view of the semiconductor device shown in FIG. 6A, in which the second polysilicon layer 230 is omitted for clarify. Stated differently, FIG. 6A is a cross-sectional view of the semiconductor device taken along line 6A-6A of FIG. 6B. After the first isolation layer 240 is formed, another etching process is performed to etch a second trench T2 penetrating the stack 200 to expose sidewalls 204 of the first polysilicon layer 210, the silicon nitride layer 220, and the second polysilicon layer 230. In greater details, a patterned hard mask layer may be formed on the stack 200 by a suitable deposition, developing, and/or etching technique, and the patterned hard mask layer may be used as an etch mask to etch the stack 200. In other words, the trench T2 penetrates the first polysilicon layer 210, the silicon nitride layer 220, and the second polysilicon layer 230. In some embodiments, as shown in FIG. 6B, the second trench T2 has a stripe shape, different from the serpentine shape of the first isolation layer 240.

In some embodiments, the etching of the stack 200 terminates at the substrate 100. In other word, the trench T2 exposes the underlying substrate 100 and a portion of the polysilicon structure 110. In some embodiments, an end point detection technique may be used in determine stopping of the stack 200 during the etching process. The etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $ND_4OH$: $H_2O_2$:$H_2O$ (APM), $NH_2OH$, KOH, $HNO_3$:$NH_4F$:$H_2O$, and/ or the like.

Figure 7:
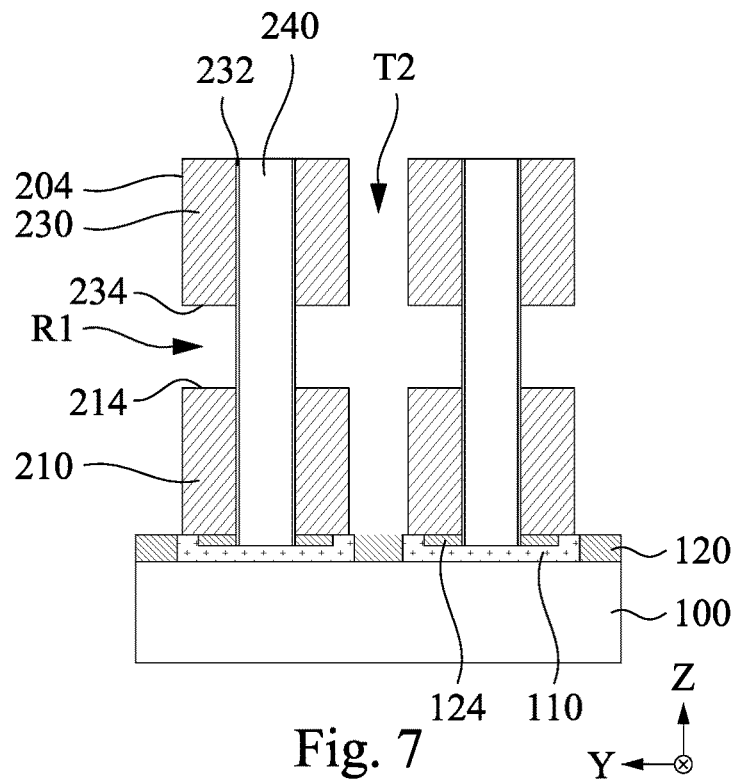

Referring to FIG. 7, a removing process is performed to form a recess R1. In greater details, the silicon nitride layer 220 (see FIG. 6A) is removed to form the recess R1 between the first polysilicon layer 210 and the second polysilicon layer 230. Since the recess R1 is formed, one portion of the liner layer 232 is exposed. In other words, one portion of the liner layer 232 is exposed by the recess R1, while the other portion of the liner layer 232 is covered by the first polysilicon layer 210 and the second polysilicon layer 230. In some embodiments, the recess R1 communicates with the second trench T2. In some embodiments, after the recess R1 is formed, a side 214 of the first polysilicon layer 210 and a side 234 of the second polysilicon layer 230 are exposed.

Figure 8:
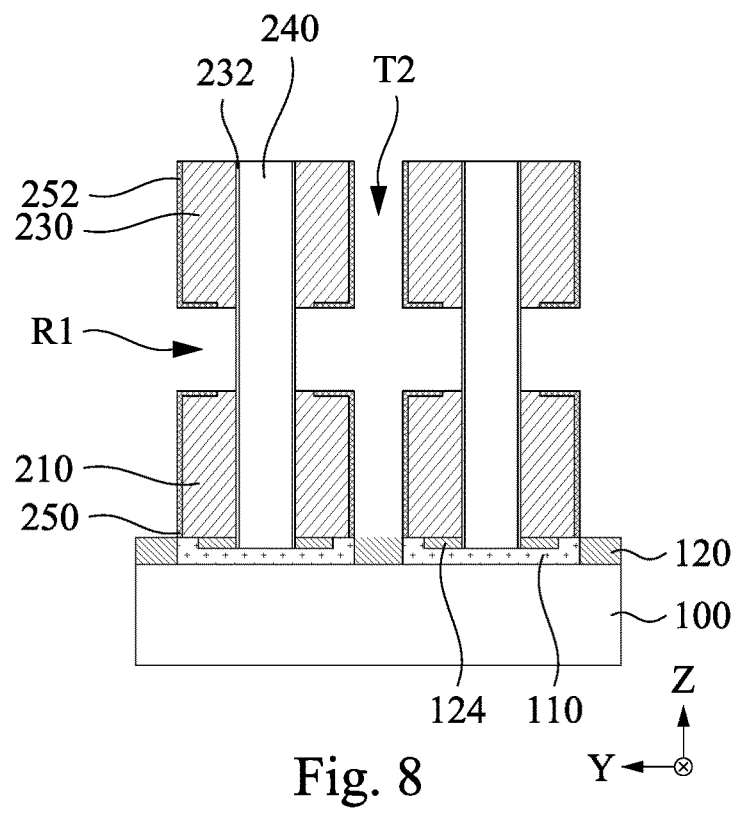

Referring to FIG. 7 and FIG. 8, after the recess R1 is formed, the exposed sidewalls 204 of the first polysilicon layer 210 and the second polysilicon layer 230 are doped to define a drain terminal contact 250 and a source terminal contact 252. In greater details, an ion implantation process is performed to the exposed sidewalls 204 of the first polysilicon layer 210 and the second polysilicon layer 230, followed by an annealing process to activate the implanted dopants. In some embodiments, doping the exposed sidewalls 204 further includes doping a side 214 of the first polysilicon layer 210 at the recess R1 and doping the side 234 of the second polysilicon layer 230 at the recess R1. In greater details, one portion of the side 214 of the first polysilicon layer 210 is doped, while the other portion of the side 214 of the first polysilicon layer 210 is not doped. Similarly, one portion of the side 234 of the second polysilicon layer 230 is doped, while the other portion of the side 234 of the second polysilicon layer 230 is not doped. In some embodiments, dopants of doping the exposed sidewalls 204 to define the drain terminal contact 250 and the source terminal contact 252 may include P-type dopants or N-type dopants. For example, P-type dopants may be boron (B), $BF_2$ or $BF_3$, and N-type dopants may be phosphorous (P), arsenic (As), or antimony (Sb). In the present embodiments, the drain terminal contact 250 and the source terminal contact 252 include N-type dopants. In some embodiments, the drain terminal contact 250 and the source terminal contact 252 are disposed on the different sides of the recess R1. Stated differently, the drain terminal contact 250 and the source terminal contact 252 are separated apart by the recess R1.

Figure 9A:
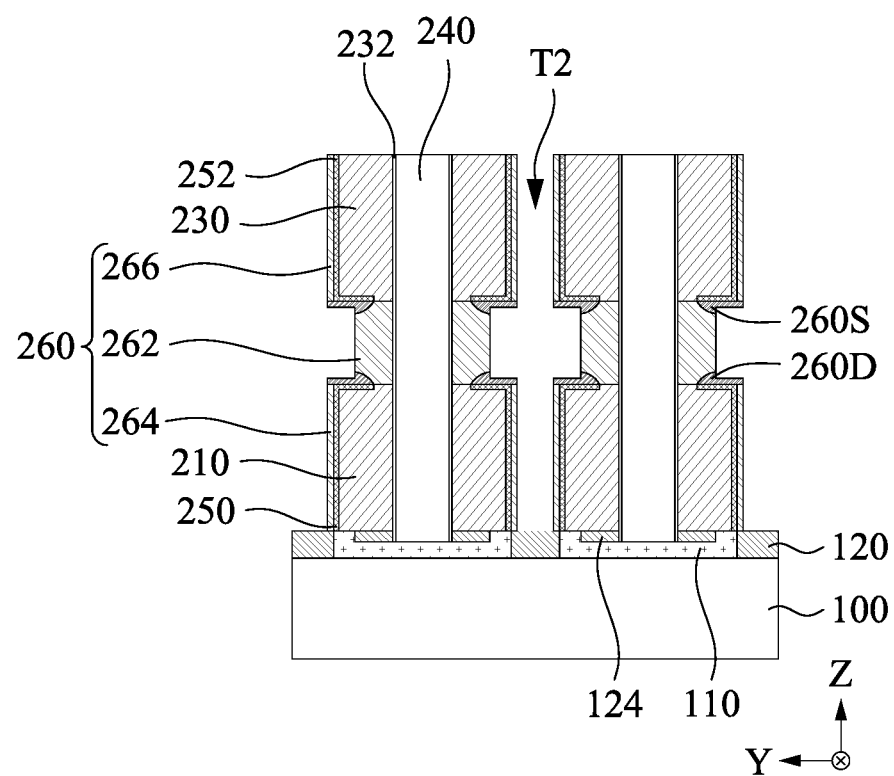
Figure 9B:
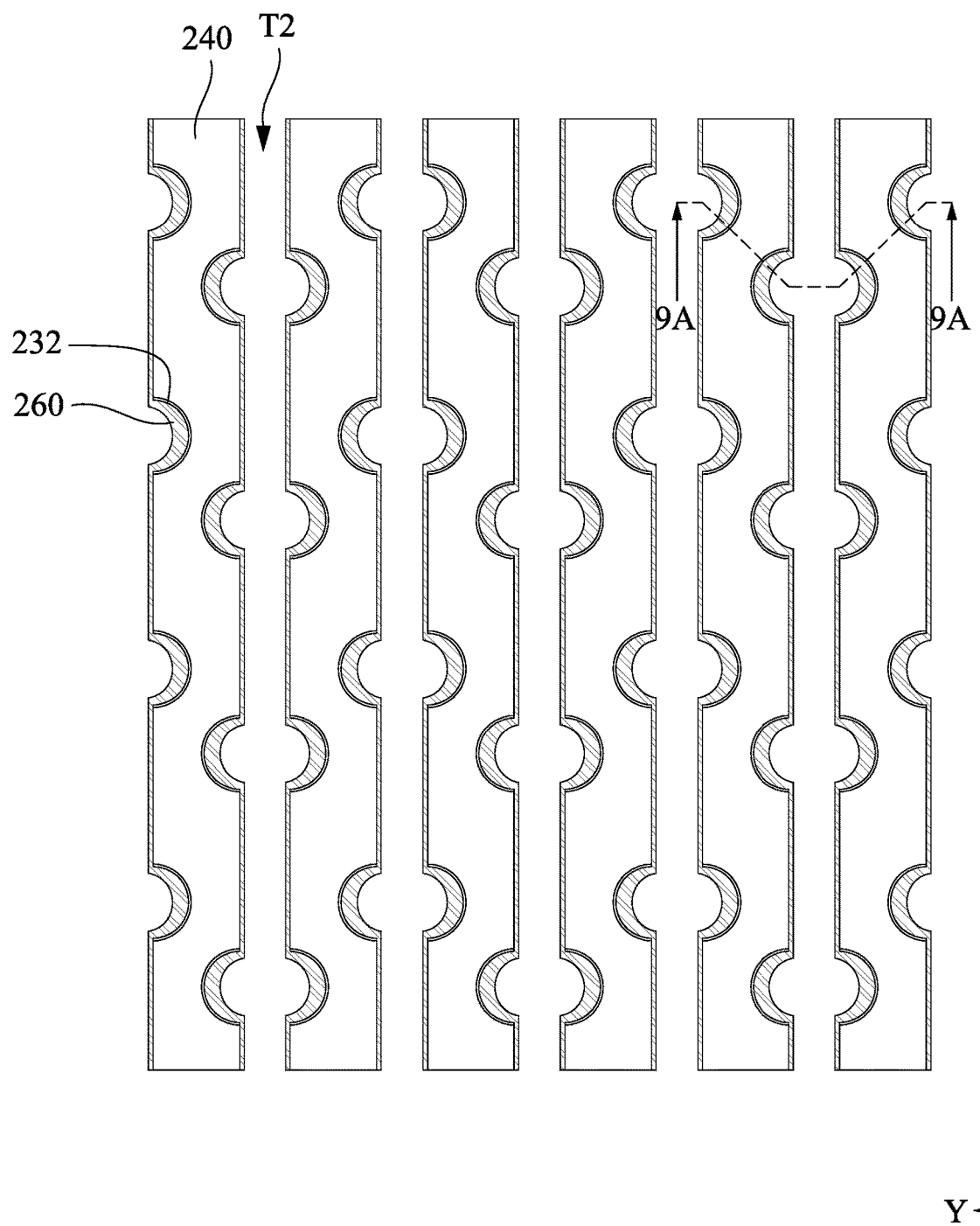
FIGS. 9B, 11B, 12B, and 13B are top views of the semiconductor device respectively shown in FIGS. 9A, 11A, 12A, and 13A, in which the second polysilicon layer is omitted for clarity.

Referring to FIG. 9A and FIG. 9B, FIG. 9B is a top view of the semiconductor device shown in FIG. 9A, in which the second polysilicon layer 230 is omitted for clarify. Stated differently, FIG. 9A is a cross-sectional view of the semiconductor device taken along line 9A-9A of FIG. 9B. In the present embodiment, a recessed cell integration process is performed. That is, a third polysilicon layer 260 is filled in the recess R1 (see FIG. 8). In greater details, the third polysilicon layer 260 is formed on the first polysilicon layer 210 and the second polysilicon layer 230, and formed in the recess R1, such that the third polysilicon layer 260 has a concave portion 262 between the first polysilicon layer 210 and the second polysilicon layer 230.

After the third polysilicon layer 260 is formed, the concave portion 262 of the third polysilicon layer 260 is doped to define a drain region 260D and a source region 260S. A direction of the drain region 260D and the source region 260S are aligned along Z axis. In greater details, the drain region 260D and the source region 260S are formed in the third polysilicon layer 260 by controlling dopants of ion implantation with a specific angle, followed by an annealing process to activate the implanted dopants. In some embodiments, dopants of doping the concave portion 262 of the third polysilicon layer 260 to define the drain region 260D and the source region 260S may include P-type dopants or N-type dopants. For example, P-type dopants may be boron (B), $BF_2$ or $BF_3$, and N-type dopants may be phosphorous (P), arsenic (As), or antimony (Sb). In the present embodiments, the drain region 260D and the source region 260S include N-type dopants.

In some embodiments, the third polysilicon layer 260 covers the first polysilicon layer 210 and the second polysilicon layer 230. In some embodiments, the third polysilicon layer 260 further has a first portion 264 and a second portion 266 connected to the concave portion 262. The first portion 264 is disposed on the first polysilicon layer 210, the second portion 266 is disposed on the second polysilicon layer 230, and the concave portion 262 is disposed on the exposed portion of the liner layer 232. In other words, the first portion 264 and the second portion 266 protrude from the concave portion 262. In some embodiments, the first portion 264 and the second portion 266 are in contact with the drain terminal contact 250 and the source terminal contact 252, respectively.

Figure 10:
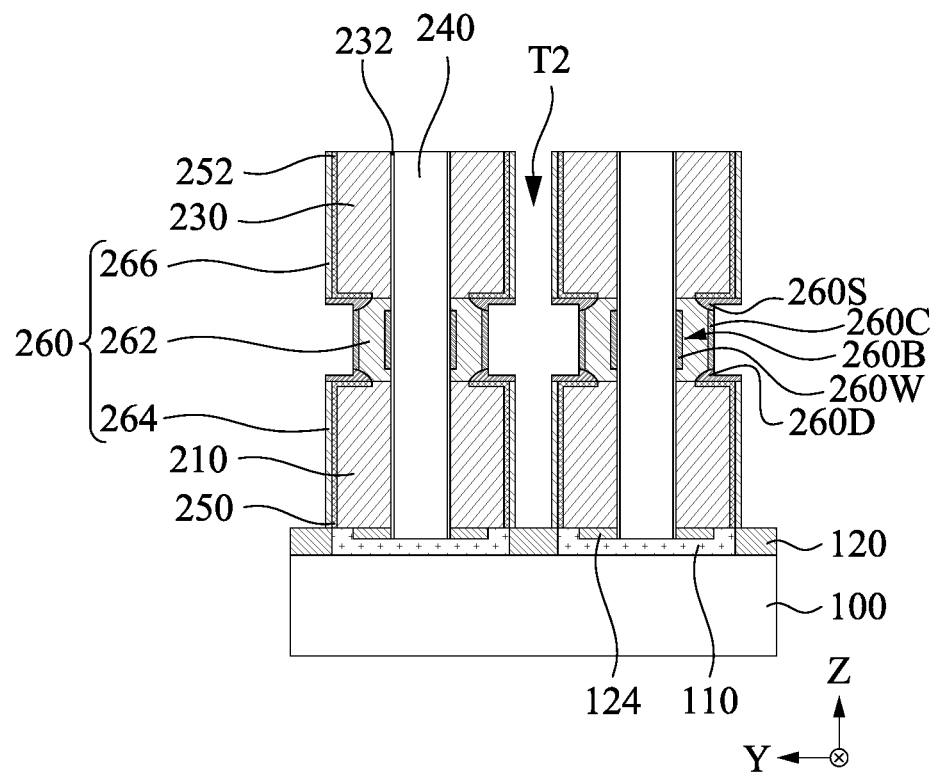

Referring to FIG. 10, after the concave portion 262 is doped to define the drain region 260D and the source region 260S, an inside of the concave portion 262 is doped to form a well region 260W. The well region 260W is a portion of a bulk 260B. Then, the concave portion 262 is doped to define a channel region 260C and the critical voltage is adjusted by controlling doping concentration and doping range. In greater details, the channel region 260C is formed in the concave portion 262 of the third polysilicon layer 260 by controlling dopants of ion implantation with a specific angle, followed by an annealing process to activate the implanted dopants. The channel region 260C is between the drain region 260D and the source region 260S. In some embodiments, dopants of doping the concave portion 262 of the third polysilicon layer 260 to define the channel region 260C may include P-type dopants or N-type dopants. In greater details, the channel region 260C is performed by lightly doping the concave portion 262, in the present embodiments. For example, P-type dopants may be boron (B), $BF_2$ or $BF_3$, and N-type dopants may be phosphorous, arsenic (As), or antimony (Sb). In the present embodiments, the channel region 260C includes P-type dopants. The dopants of the channel region 260C may be different from the dopants of the drain region 260D and the source region 260S. In some embodiments, the concave portion 262 is defined as a main body of a memory device. In other words, the source region 260S, the drain region 260D, and the channel region 260C can serve as a transistor that acts as a portion of a memory device.

In some embodiments, the annealing process performed after the implant process is a rapid thermal annealing (RTA) process performed at a temperature in a range from about 700 Celsius to about 1500 Celsius for the duration in a range from about 5 seconds to about 250 seconds. In further embodiments, conventional furnace annealing (CFA) process may be performed at a temperature in a range from about 900 Celsius to about 1500 Celsius for duration in a range from about 30 minutes to about 3 hours.

Figure 11A:
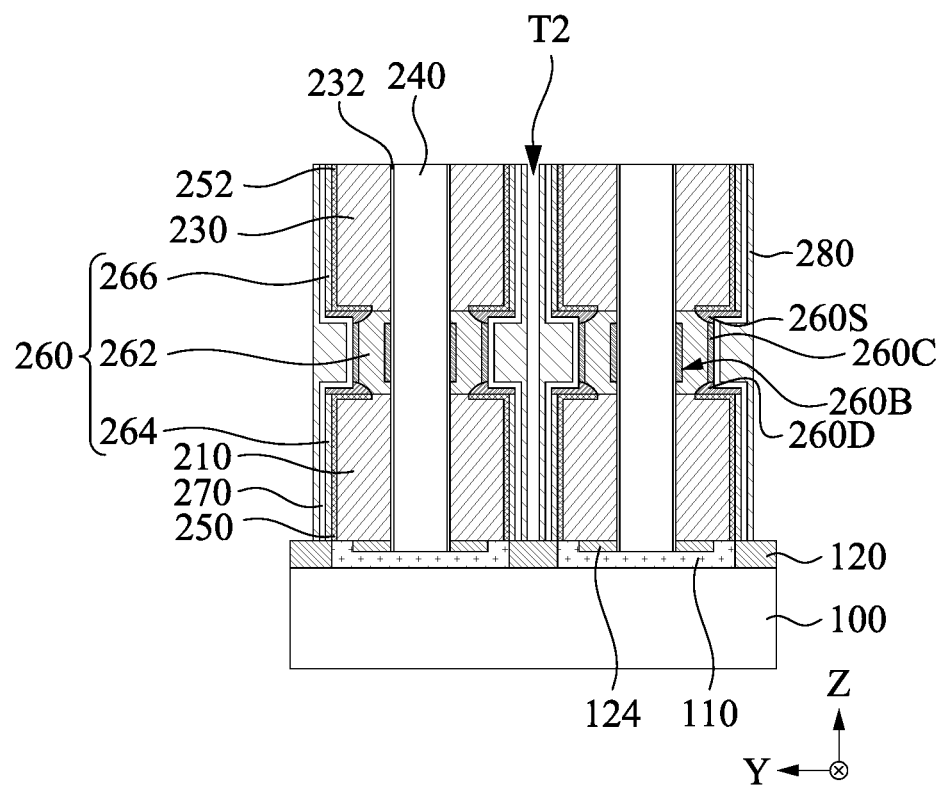
Figure 11B:
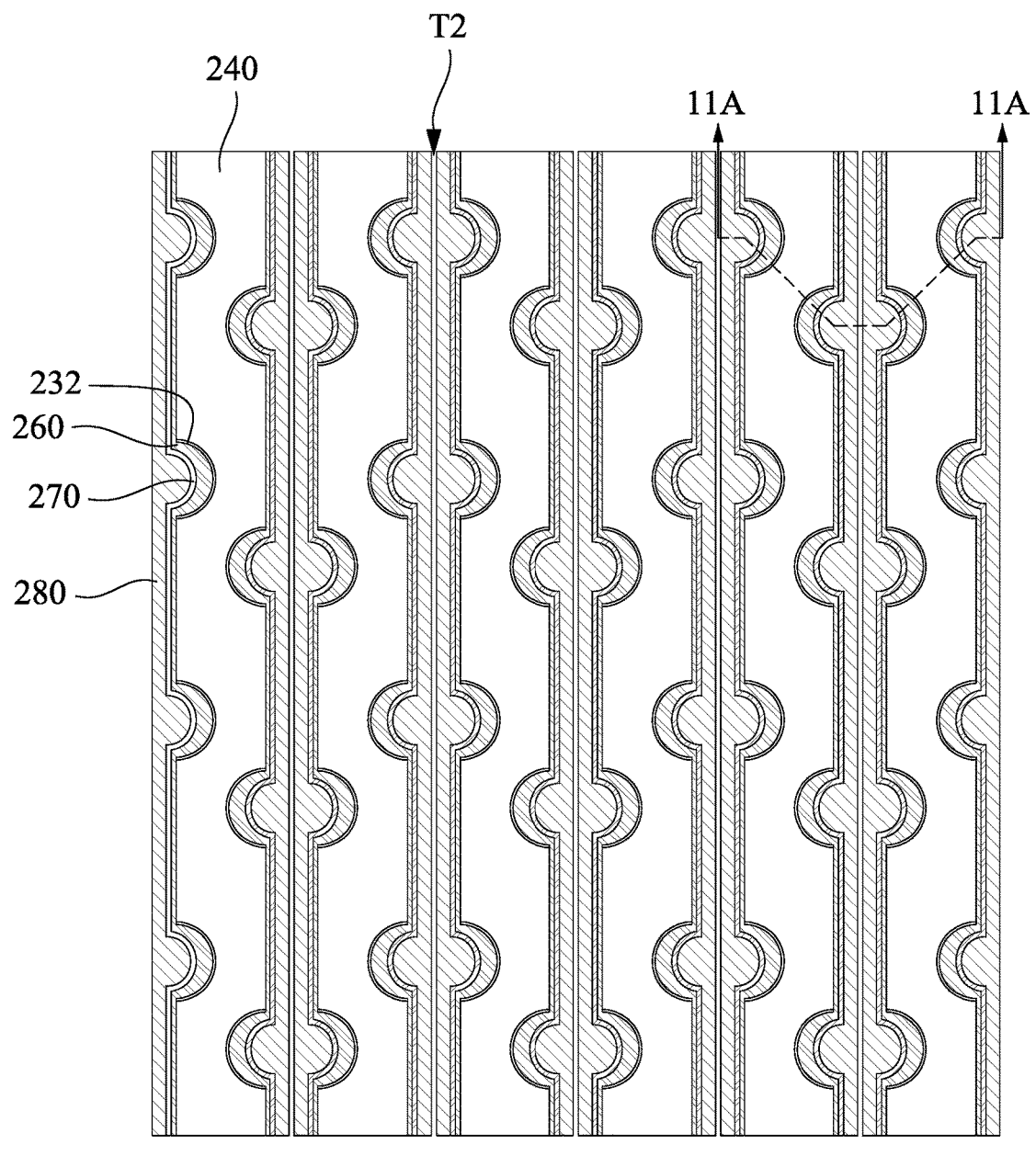
Figure 11B:
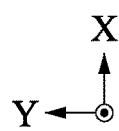

Referring to FIG. 11A and FIG. 11B, FIG. 11B is a top view of the semiconductor device shown in FIG. 11A, in which the second polysilicon layer 230 is omitted for clarify. Stated differently, FIG. 11A is a cross-sectional view of the semiconductor device taken along line 11A-11A of FIG. 11B. A gate dielectric layer 270 is formed on the third polysilicon layer 260. Specifically, the gate dielectric layer 270 is formed on a sidewall of the third polysilicon layer 260. After the gate dielectric layer 270 is formed, a gate conductive layer 280 is formed on the gate dielectric layer 270, and the gate conductive layer 280 is defined as a word line. In greater details, the gate dielectric layer 270 is formed to be conformal on the sidewall of the third polysilicon layer 260, and the gate conductive layer 280 is formed on the gate dielectric layer 270. Stated differently, the gate dielectric layer 270 is between the third polysilicon layer 260 and the gate conductive layer 280.

In some embodiments, as shown in FIG. 11B, the concave portion 262 of the third polysilicon layer 260 has a semi-elliptical profile, in a top view. In some embodiments, the third polysilicon layer 260 and the gate dielectric layer 270 have a semi-elliptical profile in the top view at the location where the silicon nitride layer 220 of FIG. 6B is removed. As a result, after the gate conductive layer 280 is formed, a portion of the gate conductive layer 280 that serves as a gate electrode of the memory device will have a corresponding shape, such as semi-ellipsoidal cylinder. In other words, the portion of the gate conductive layer 280 (i.e., the gate electrode) and the concave portion 262 of the third polysilicon layer 260 has the semi-elliptical profile, in the top view. However, the present disclosure is not limited thereto. A shape of the main body of the memory device viewed from above may have rectangular shape, square shape, triangular shape, trapezoidal shape, semi-circular shape, or other shapes. In some embodiments, as shown in FIG. 11B, the main body (the concave portion 262) of the memory device is arranged antisymmetrically. In other words, a distribution of the main body (the concave portion 262) of the memory device in the top view forms staggered arrangement. Specifically, the main body (the concave portion 262) of the memory device is staggered on the first isolation layer 240.

In some embodiments, the gate dielectric layer 270 is made of silicon oxide, silicon nitride, aluminum oxide, or other suitable materials. In other embodiments, the gate dielectric layer 270 is made of a combination of oxide and nitride (for example, ONO). In some embodiments, the material of the gate conductive layer 280 may include a conductive material and may be selected from polysilicon, polycrystalline silicon germanium (poly-SiGe), metal nitride, metal silicide, or a combination of other metal materials. For example, the metal nitride may be tungsten nitride, molybdenum nitride, titanium nitride, tantalum nitride, or a combination thereof. The metal silicide may be tungsten silicide, titanium silicide, cobalt silicide, nickel silicide, platinum silicide, erbium silicide, or a combination thereof. The metal may be copper, silver, or other suitable metals.

Figure 12A:
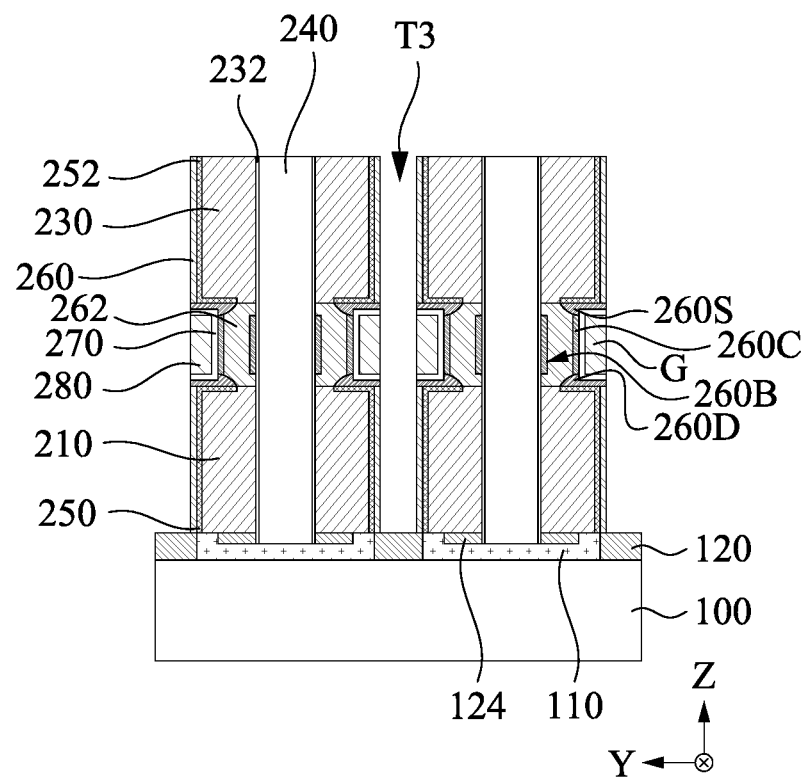
Figure 12B:
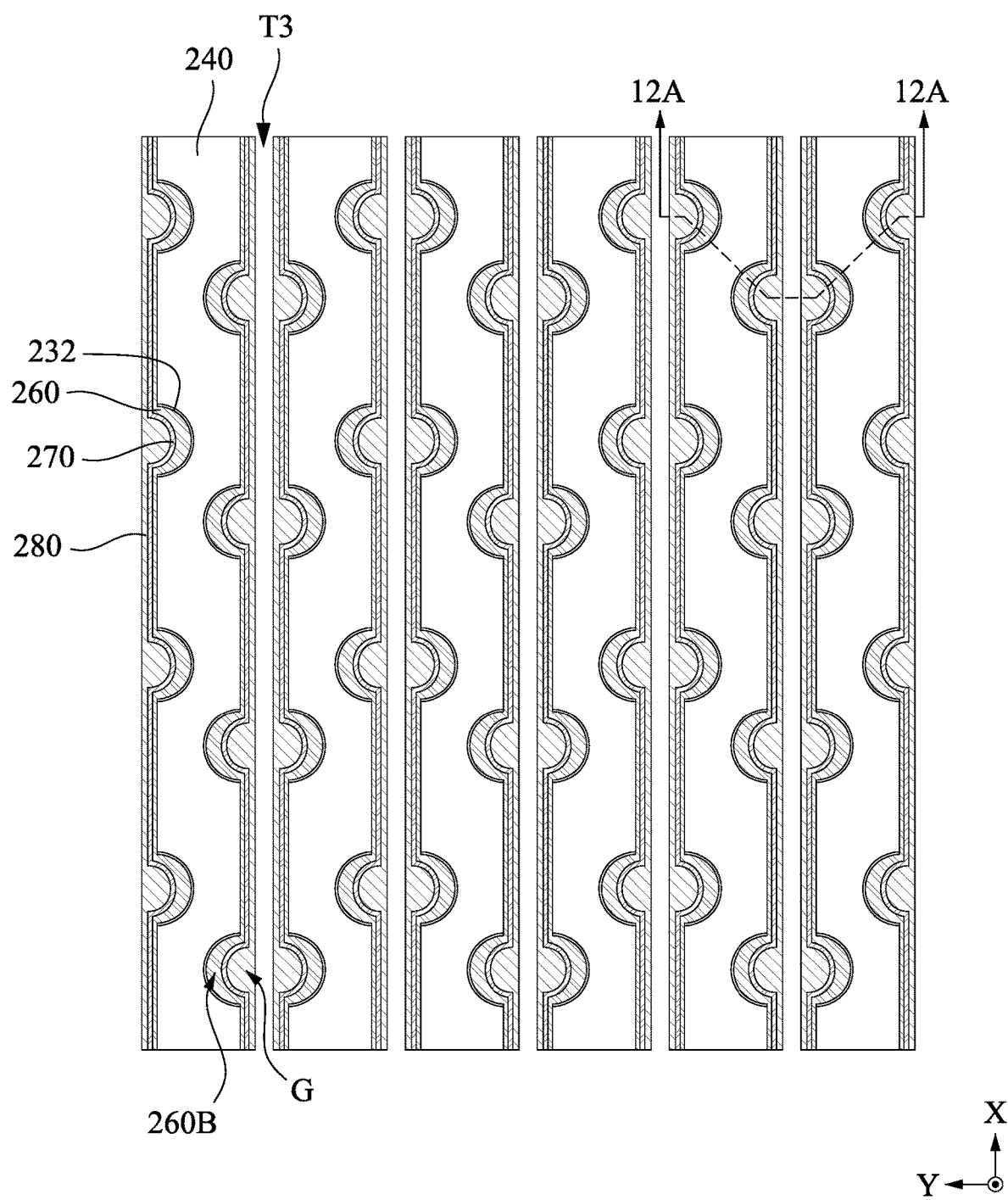

Referring to FIG. 12A and FIG. 12B, FIG. 12B is a top view of the semiconductor device shown in FIG. 12A, in which the second polysilicon layer 230 is omitted for clarify. Stated differently, FIG. 12A is a cross-sectional view of the semiconductor device taken along line 12A-12A of FIG. 12B. An etching process, e.g., shallow trench isolation (STI) etching, is performed to remove portions of the third polysilicon layer 260, the gate dielectric layer 270, and the gate conductive layer 280. In greater details, a patterned hard mask layer may be formed by a suitable deposition, developing, and/or etching technique, and the patterned hard mask layer may be used as an etch mask to etch the third polysilicon layer 260, the gate dielectric layer 270, and the gate conductive layer 280 to form a third trench T3. In some embodiments, as shown in FIG. 12B, the third trench T3 has a strip shape, in the top view.

In some embodiments, the gate dielectric layer 270 and the gate conductive layer 280 are formed in the third polysilicon layer 260. In other words, the gate dielectric layer 270 and the gate conductive layer 280 are disposed on the concave portion 262 of the third polysilicon layer 260. In some embodiments, the gate conductive layer 280 can serve as a word line (WL), and a position of the gate conductive layer 280 facing the concave portion 262 (the recess R1 in FIG. 7) may serve as gate G. In some embodiments, the bulk 260B faces toward the first isolation layer 240. In some embodiments, the bulk 260B and the gate G respectively faces toward different positions. In greater details, the bulk 260B faces toward the first trench T1 in FIG. 4B, while the gate G faces toward the second trench T2 in FIG. 9B. In other words, the bulk 260B faces toward the first trench T1 in FIG. 4B, and the gate G faces toward the third trench T3 in FIG. 12B.

Figure 12C:
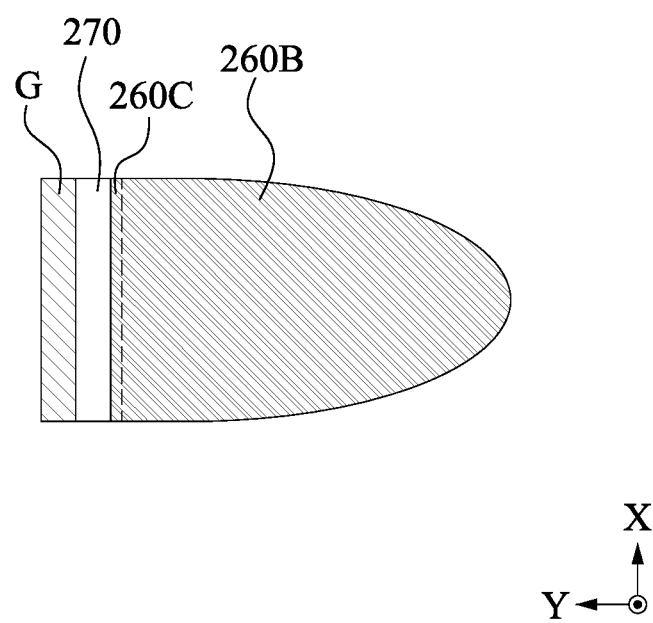
FIG. 12C is a schematic view of a transistor device of a memory device in FIG. 12B.

FIG. 12C is a schematic view of a transistor device of the memory device in FIG. 12B. As shown in FIG. 12C, the memory device includes the bulk 260B, the channel region 260C, the gate dielectric layer 270, and the gate G. The bulk 260B tapers in a direction away from the gate G. For example, the bulk 260B may taper to a point toward the gate G. A shape of the bulk 260B may be a triangle. In some embodiments, the shape of the bulk 260B may be a semi-ellipsoid, a semi-circle, or a trapezoid.

Figure 13A:
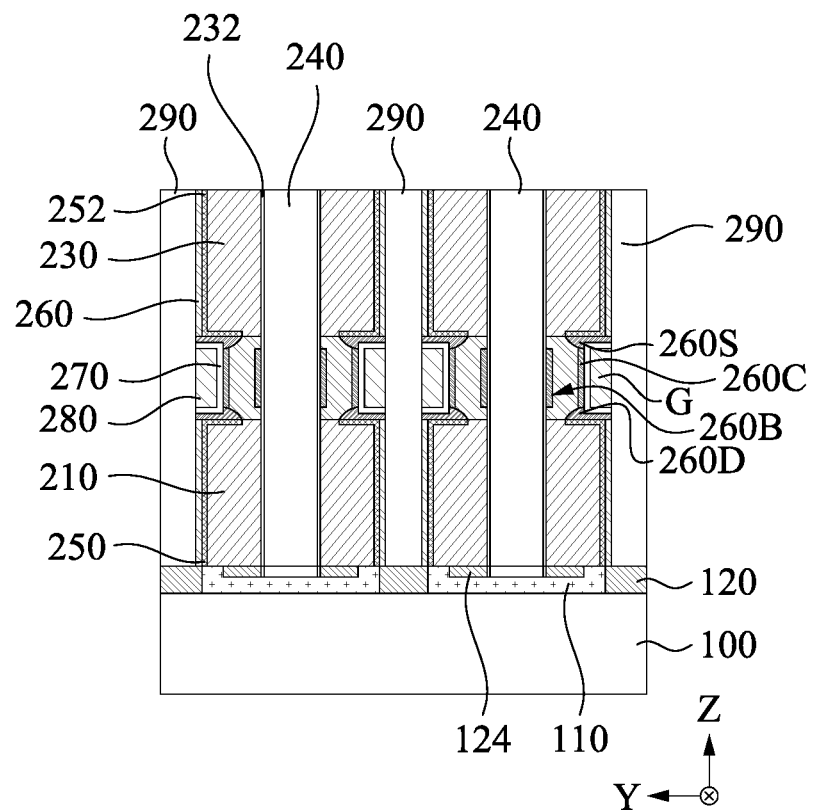
Figure 13B:
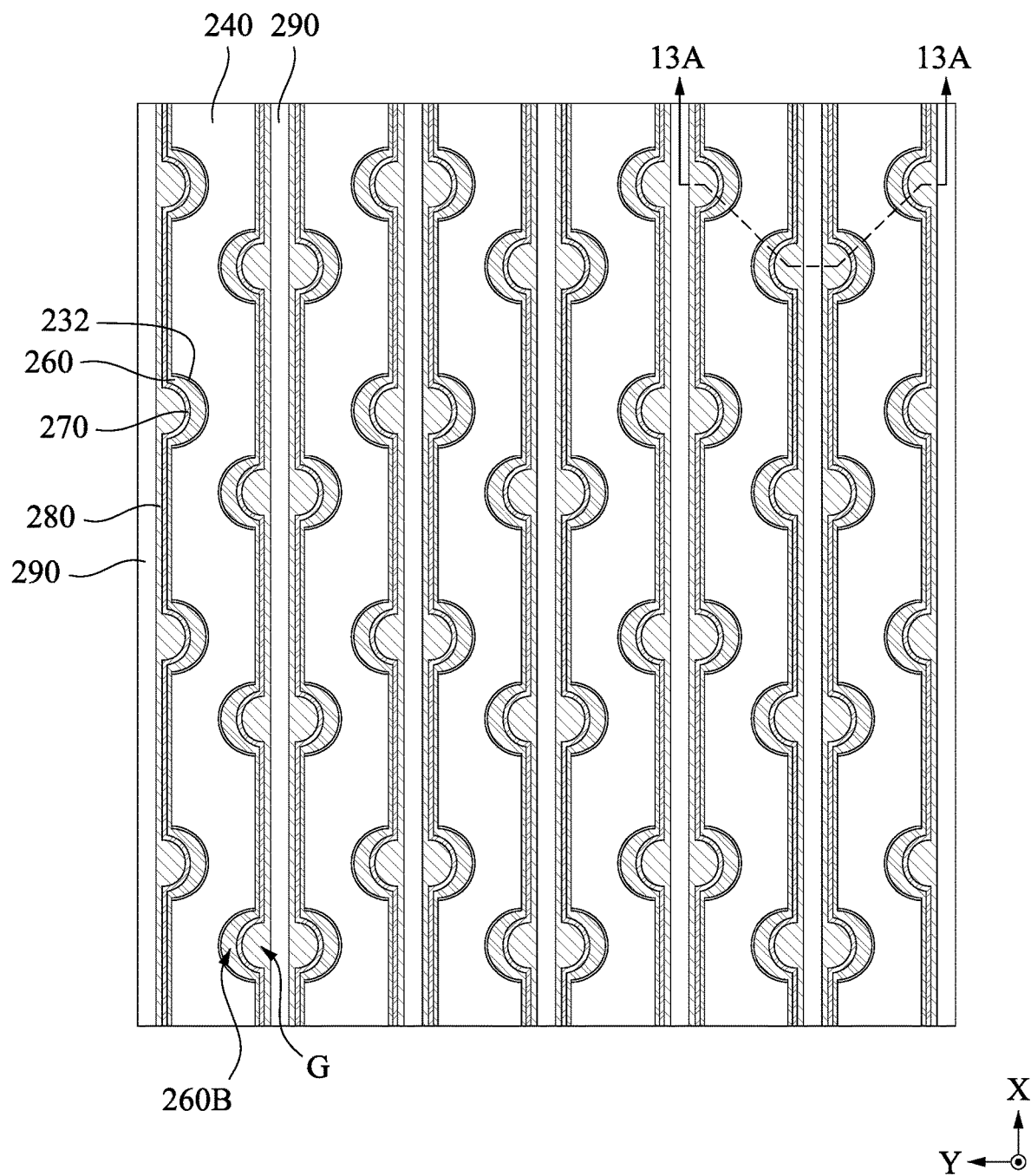

Referring to FIG. 13A and FIG. 13B, FIG. 13B is a top view of the semiconductor device shown in FIG. 13A, in which the second polysilicon layer 230 is omitted for clarify. Stated differently, FIG. 13A is a cross-sectional view of the semiconductor device taken along line 13A-13A of FIG. 13B. The third trench T3 of FIG. 12A and FIG. 12B is filled with insulating materials to form second isolation layer 290. In other words, the second isolation layer 290 is formed on the gate conductive layer 280. In some embodiments, a length direction of the second isolation layer 290 is parallel to a length direction of the first isolation layer 240. In some embodiments, as shown in FIG. 13B, the second isolation layer 290 is alternately arranged with the first isolation layer 240, in the top view. In some embodiments, as shown in FIG. 13B, the second isolation layer 290 has a strip shape, while the first isolation layer 240 has a serpentine shape, in the top view. In some embodiments, the bulk 260B faces toward the first isolation layer 240, while the gate G faces toward the second isolation layer 290. In other words, the bulk 260B and the gate G are disposed on opposite sides of the gate dielectric layer 270.

In some embodiments, after the second isolation layer 290 is formed, a planarization process, such as a CMP process, may be performed to remove excess materials of the second isolation layer 290. In some embodiments, the second isolation layer 290 includes silicon oxide layer, silicon nitride layer or silicon oxynitride layer, and the like. The second isolation layer 290 may be made of low-k dielectric material, such as tetraethoxysilane (TEOS). The second isolation layer 290 may be formed by CVD, PECVD, ALD, FCVD, LPCVD, or other suitable methods.

Figure 14:
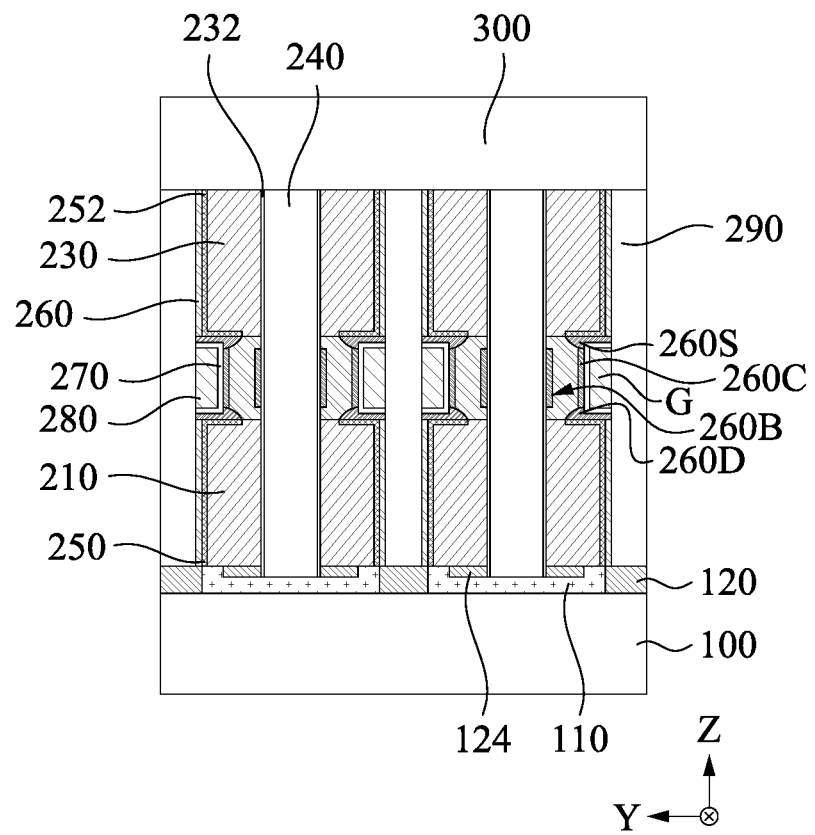

Referring to FIG. 14, after the second isolation layer 290 is formed, a third isolation layer 300 is formed on the stack 200 (see FIG. 6A). In other words, the third isolation layer 300 is formed on the second isolation layer 290 and the third polysilicon layer 260. Stated differently, the third isolation layer 300 is formed on the first isolation layer 240 and the second isolation layer 290. In some embodiments, the third isolation layer 300 is perpendicular to the second isolation layer 290. In other words, a length direction of the third isolation layer 300 is perpendicular to a length direction of the third polysilicon layer 260. In some embodiments, the third isolation layer 300 is an inter-metal dielectric (IMD) layer. The third isolation layer 300 may be made of a low dielectric material. For example, the low dielectric material may be a doped oxide, such as phosphor silicate glass (PSG), boron phosphor silicate glass (BPSG), or other suitable materials.

Figure 15:
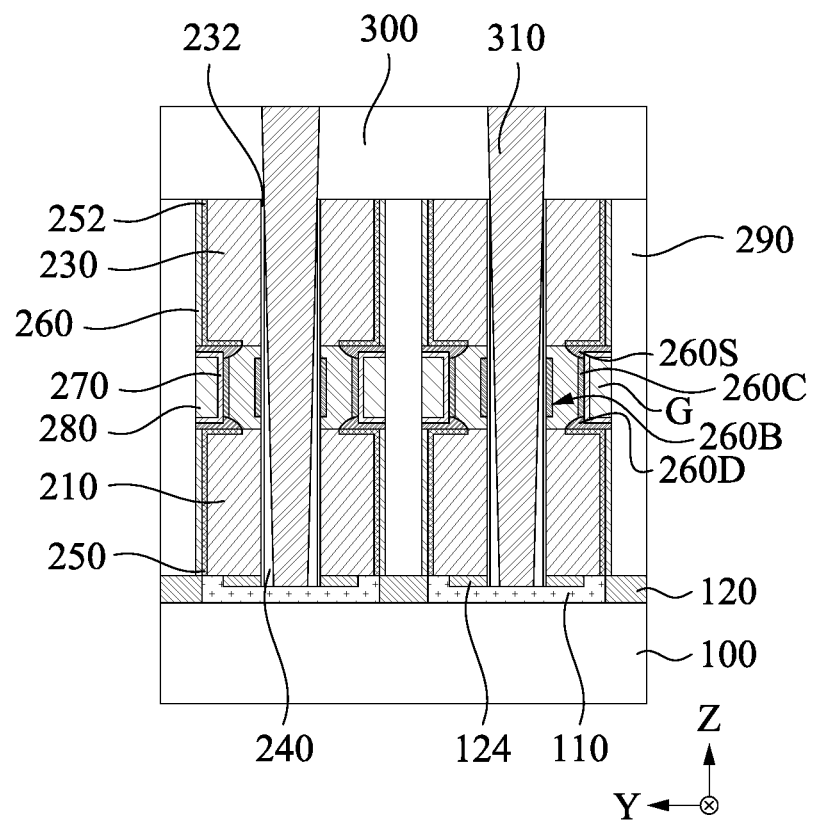

Referring to FIG. 15, a bit line via contact 310 is formed through the third isolation layer 300 and the first isolation layer 240. In greater details, the method of forming the bit line via contact 310 may include etching the third isolation layer 300 and the first isolation layer 240 to form a via hole, and then filling conductive material in the via hole. In other words, the first isolation layer 240 is etched to leave a portion of the remaining first isolation 240, and then the bit line via contact 310 is formed through the first isolation layer 240 and the third isolation layer 300. In some embodiments, after the bit line via contact 310 is formed, a planarization process, such as a CMP process, may be performed to remove excess materials of the bit line via contact 310. In some embodiments, a bottom surface of the bit line via contact 310 is below a top surface of the substrate 100. In other words, the bottom surface of the bit line via contact 310 and a bottom surface of the third block structure 124 are at same horizontal level. In some embodiments, the bit line via contact 310 is made of doped polysilicon or metal.

Figure 16:
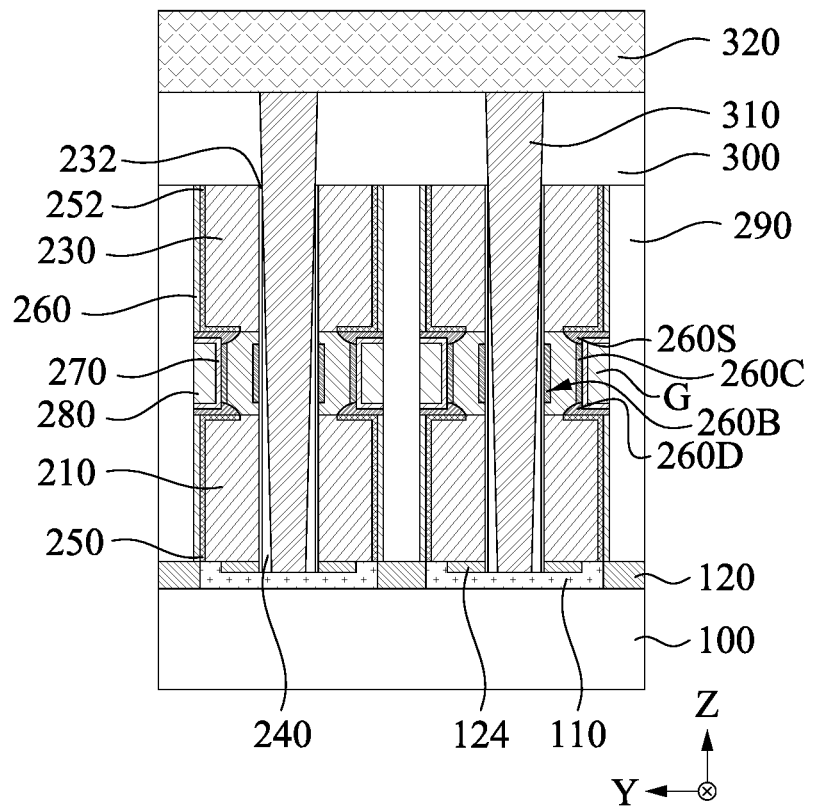

Referring to FIG. 16, a conductive layer 320 is formed on the bit line via contact 310, and the conductive layer 320 is defined as a bit line. In some embodiments, an isolation layer, such as an inter-metal dielectric (IMD) layer, is formed at the same horizontal level as the conductive layer 320. In other words, the isolation layer is coplanar with the conductive layer 320.

In some embodiments, a current would flow from the conductive layer 320, through the bit line via contact 310, and to the polysilicon structure 110. The polysilicon structure 110 may serve as the BL buried connection structure, which is beneficial to achieve the current uniformity, and the arrangement of the third block structure 124 is beneficial to prevent the current leakage and current dispersion.

Figure 17:
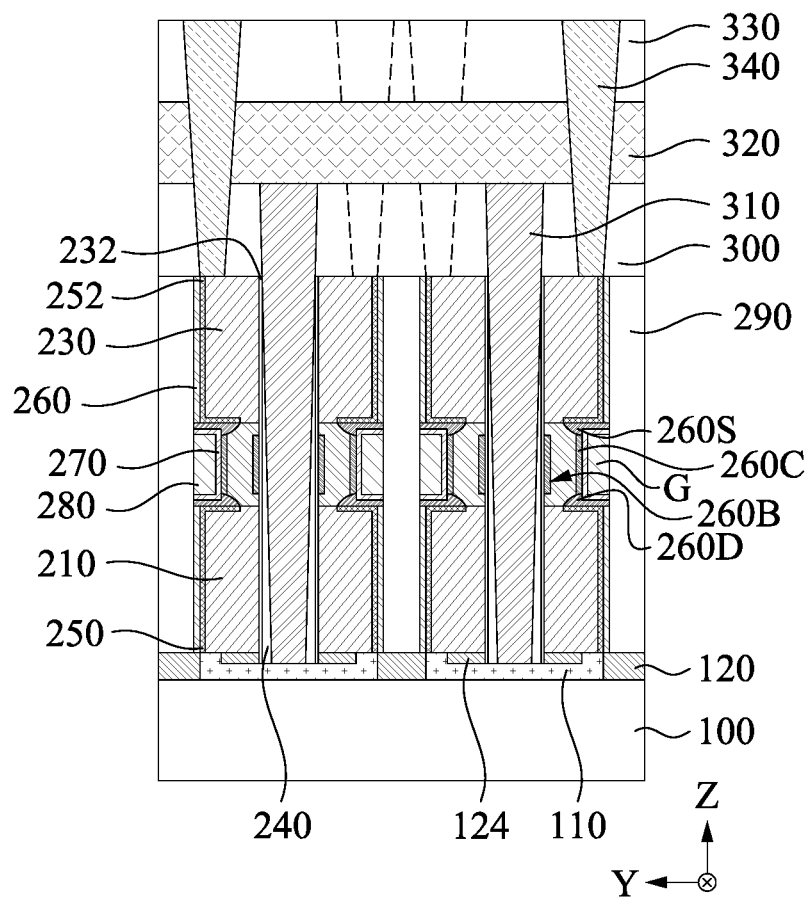

Referring to FIG. 17, after the conductive layer 320 is formed, a fourth isolation layer 330 is formed on the conductive layer 320. Thereafter, a capacitor landing pad 340 is formed through the fourth isolation layer 330, the conductive layer 320, and the third isolation layer 300. In greater details, the method of forming the capacitor landing pad 340 may include etching the fourth isolation layer 330, the conductive layer 320, and the third isolation layer 300 to form a via hole, and then filling conductive material in the via hole. For convenience of explanation, dashed lines in FIG. 17 are used to illustrate the capacitor landing pad 340 located on the rear side of the conductive layer 320. In some embodiments, after the capacitor landing pad 340 is formed, a planarization process, such as a CMP process, may be performed to remove excess materials of the capacitor landing pad 340.

In some embodiments, a vertical projection region of the bit line via contact 310 on the substrate 100 is not overlapped with a vertical projection region of the capacitor landing pad 340 on the substrate 100.

In some embodiments, the fourth isolation layer 330 is an inter-metal dielectric (IMD) layer. The fourth isolation layer 330 may be made of a low dielectric material. For example, the low dielectric material may be a doped oxide, such as phosphor silicate glass (PSG), boron phosphor silicate glass (BPSG), or other suitable materials. In some embodiments, the capacitor landing pad 340 is made of doped polysilicon or metal.

Figure 18A:
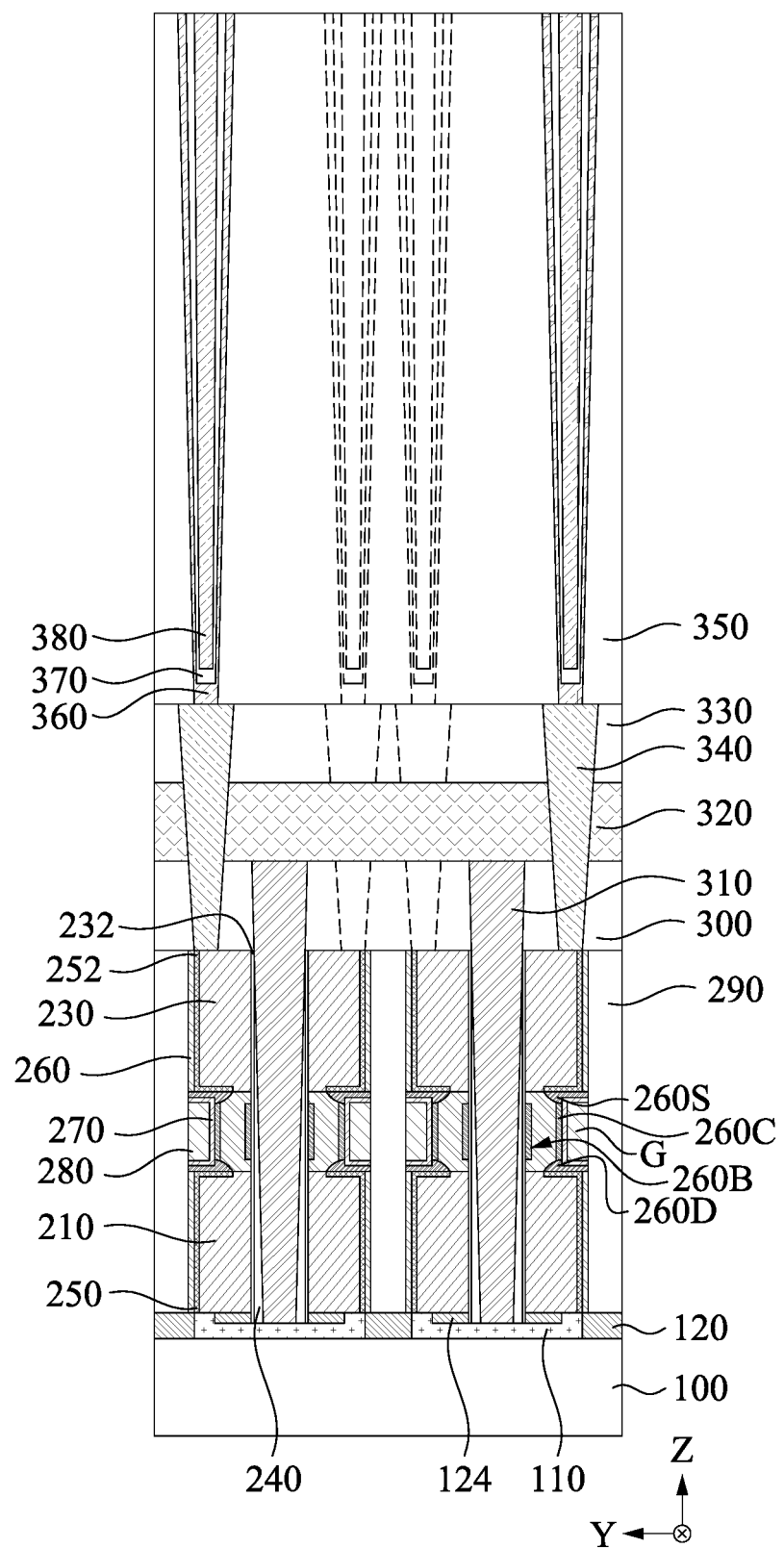
Figure 18B:
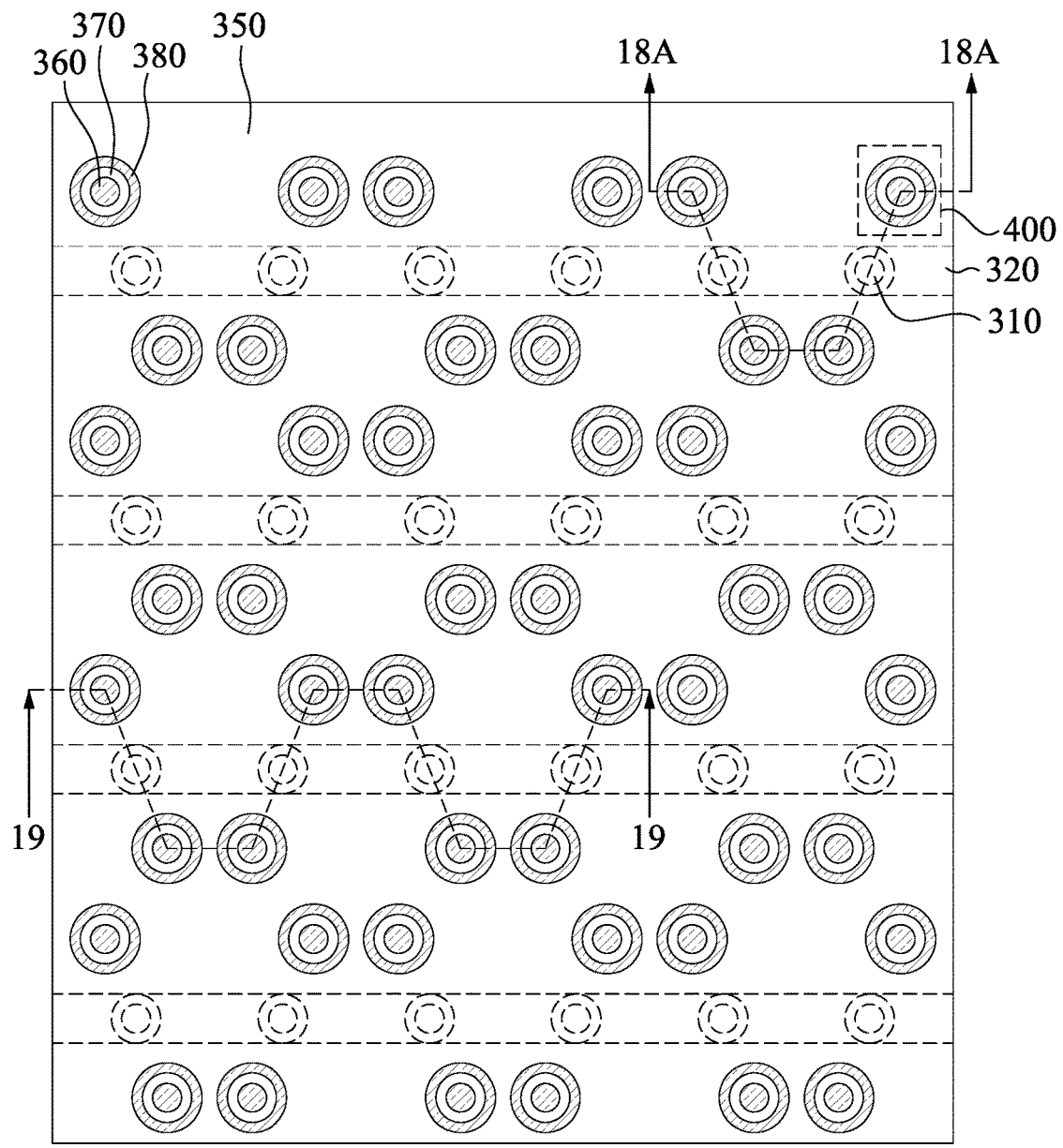
FIG. 18B is a top view of the semiconductor device of FIG. 18A.
Figure 19:
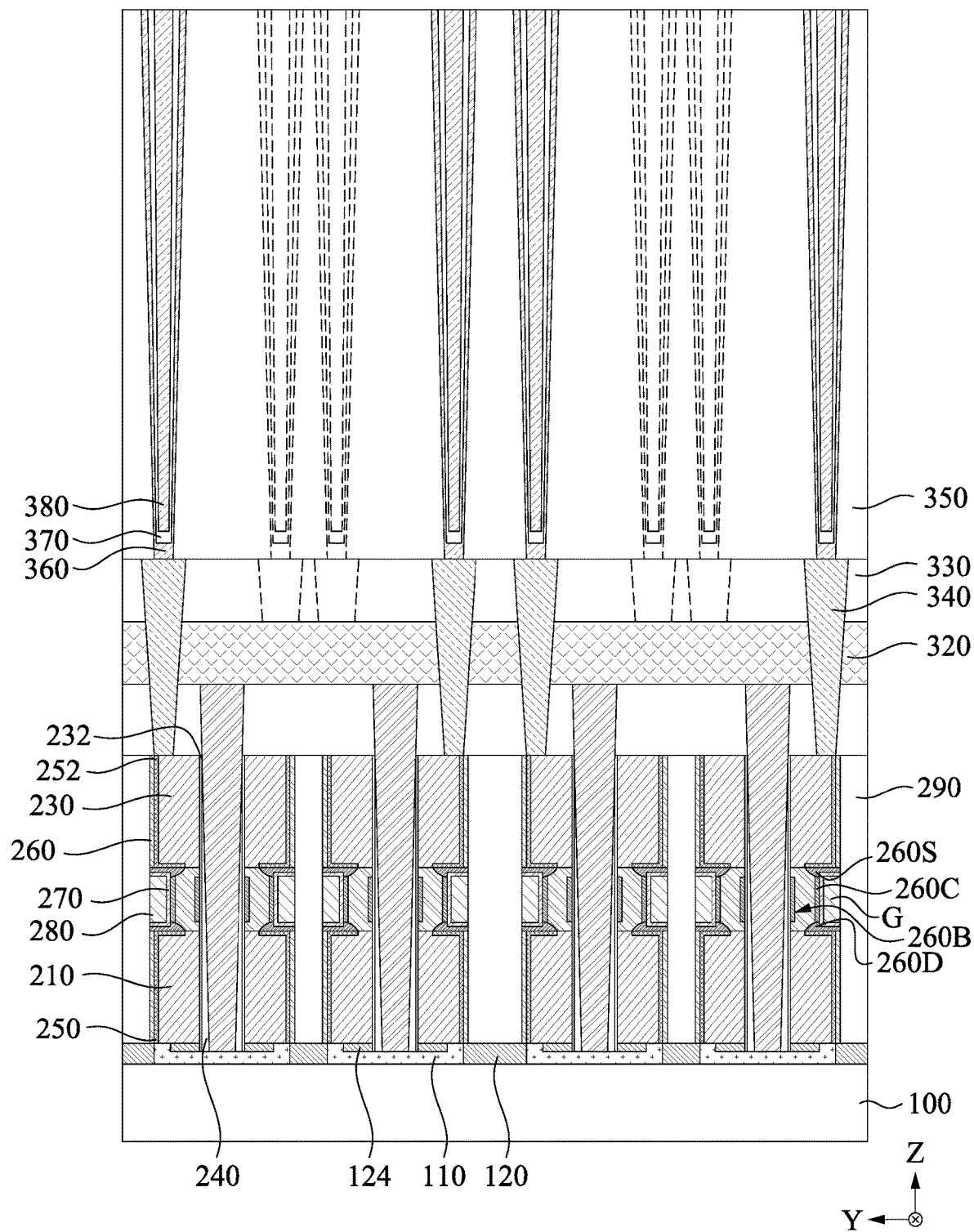
FIG. 19 is a cross-sectional view of the semiconductor device taken along line 19-19 of FIG. 18B.

Referring to FIG. 18A, FIG. 18B and FIG. 19, FIG. 18B is a top view of the semiconductor device of FIG. 18A, and FIG. 19 is a cross-sectional view of the semiconductor device taken along line 19-19 of FIG. 18B. Stated differently, FIG. 18A and FIG. 19 are cross-sectional views of semiconductor device taken along line 18A-18A and line 19-19 of FIG. 18B, respectively. For convenience of explanation, dashed lines in FIG. 18A and FIG. 19 are used to illustrate the bottom electrode plate 360, the high-k dielectric layer 370, and the top electrode plate 380 located on the rear side of the conductive layer 320. In addition, for clarify, dashed lines in FIG. 18B are used to illustrate the conductive layer 320 and the underlying bit line via contact 310. After the capacitor landing pad 340 is formed, a fifth isolation layer 350 is formed on the capacitor landing pad 340 and the fourth isolation layer 330. In some embodiments, a thickness of the fifth isolation layer 350 is larger than a thickness of the fourth isolation layer 330.

After the fifth isolation layer 350 is formed, the bottom electrode plate 360, the high-k dielectric layer 370, and the top electrode plate 380 are formed in sequence in the fifth isolation layer 350. In other words, the bottom electrode plate 360, the high-k dielectric layer 370, and the top electrode plate 380 are formed embedded in the fifth isolation layer 350. In the present embodiment, the bottom electrode plate 360, the high-k dielectric layer 370, and the top electrode plate 380 are defined as a capacitor of the memory device. In some embodiments, the capacitor (including the bottom electrode plate 360, the high-k dielectric layer 370, and the top electrode plate 380) is formed over the conductive layer 320, which is called capacitor over bit line (COB).

In greater details, the method of forming the capacitor may include etching the fifth isolation layer 350 to form a via hole, and then filling a first conductive material, an insulating material, and a second conductive material in the via hole to form the capacitor. In some embodiments, after the capacitor is formed, a planarization process, such as a CMP process, may be performed to remove excess materials of the capacitor. In some embodiments, the bottom electrode plate 360 wraps around the high-k dielectric layer 370, and the high-k dielectric layer 370 wraps the top electrode plate 380. In some embodiments, the bottom electrode plate 360 is in contact with the capacitor landing pad 340. In some embodiments, a width of a bottom surface of the bottom electrode plate 360 is smaller than a width of a top surface of the capacitor landing pad 340. In some embodiments, a vertical projection region of the bottom electrode plate 360 on the substrate 100 is overlapped with the vertical projection region of the capacitor landing pad 340 on the substrate 100.

In some embodiments, the fifth isolation layer 350 is an inter-metal dielectric (IMD) layer. The fifth isolation layer 350 may be made of a low dielectric material. For example, the low dielectric material may be a doped oxide, such as phosphor silicate glass (PSG), boron phosphor silicate glass (BPSG), or other suitable materials. In some embodiments, the bottom electrode plate 360 and the top electrode plate 380 are made of same materials, such as doped polysilicon.

In some embodiments, the capacitor (including the bottom electrode plate 360, the high-k dielectric layer 370, and the top electrode plate 380), the capacitor landing pad 340, the drain terminal contact 250, the source terminal contact 252, and the main body (the concave portion 262) are defined as a DRAM cell 400. An area density of the DRAM cell 400 is less than six times a square of a feature size ($F^2$), per cell. For example, the area density of the DRAM cell 400 may be $5F^2$. By using the above mentioned structure of the semiconductor device, a density of the semiconductor device can be increased, thereby improving a performance of the semiconductor device.

In some embodiments, after the capacitor is formed, a sixth isolation layer (not shown) is formed. The sixth isolation layer serves as a protective layer. In greater details, the sixth isolation layer covers the bottom electrode plate 360, the high-k dielectric layer 370, and the top electrode plate 380.

Figure 20:
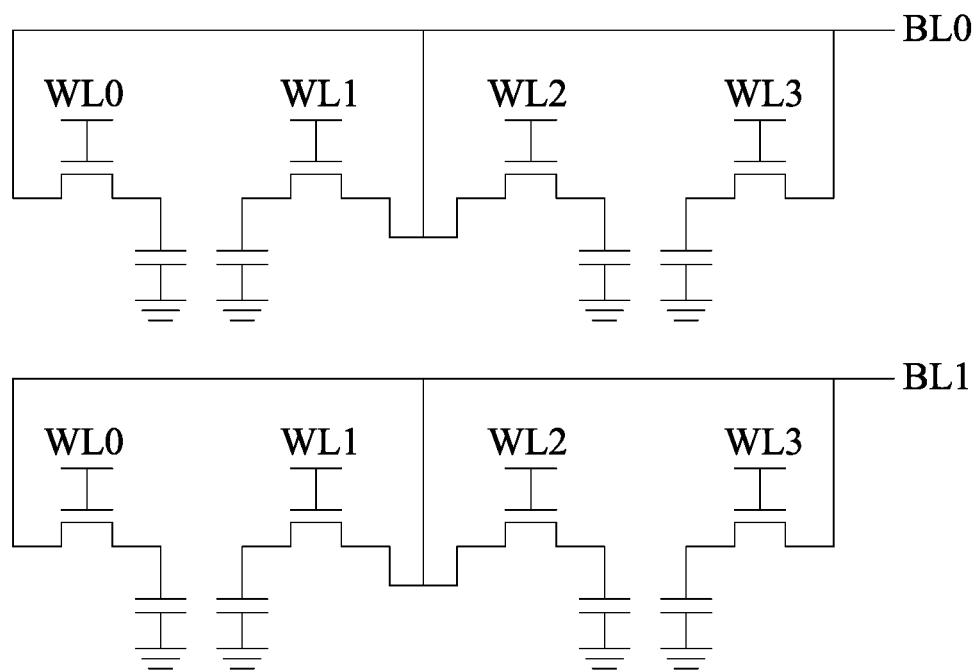
FIG. 20 is a circuit diagram of a DRAM array in accordance with some embodiments of the present disclosure.

Referring to FIG. 20, FIG. 20 is a circuit diagram of a DRAM array in accordance with some embodiments of the present disclosure. FIG. 20 shows a simple example with the 2×4 cell matrix. The gate of the DRAM cell of the first row is connected to the first word line WL0, and the gate of the DRAM cell of the second row is connected to the second word line WL1. And similarly, the gate of the DRAM cell of the third row is connected to the third word line WL2, and the gate of the DRAM cell of the fourth row is connected to the fourth word line WL3. The aforementioned gate conductive layer 280 may act as the first word line WL0, the second word line WL1, the third word line WL2, and the fourth word line WL3. The drain of the DRAM cell of the first column is connected to the first bit line BL0, and the drain of the DRAM cell of the second column is connected to the second bit line BL1. The aforementioned conductive layer 320 may act as the first bit line BL0 and the second bit line BL1. The terminal source is connected to the bottom electrode plate of the capacitor, and then the top electrode plate of the capacitor is connected to the ground as well.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A semiconductor device, comprising:
   a substrate;
   a first polysilicon layer and a second polysilicon layer on the substrate;
   a third polysilicon layer between the first polysilicon layer and the second polysilicon layer, wherein the third polysilicon layer has a concave portion, the concave portion is between the first polysilicon layer and the second polysilicon layer, and the concave portion is defined as a main body of a memory device, and wherein the main body comprises a bulk;
   a first isolation layer adjacent with the first polysilicon layer, the second polysilicon layer, and the third polysilicon layer, wherein the first isolation layer has a serpentine shape, in a top view;
   a gate dielectric layer and a gate conductive layer in the third polysilicon layer, and the gate dielectric layer protruding from the third polysilicon layer, wherein the gate conductive layer facing the concave portion serves as a gate;
   a second isolation layer on the gate conductive layer and the third polysilicon layer, wherein the bulk and the gate respectively faces toward the first isolation layer and the second isolation layer;
   a third isolation layer on the first isolation layer and the second isolation layer;
   a bit line via contact through the first isolation layer and the third isolation layer; and
   a conductive layer on the bit line via contact and the third isolation layer, wherein the conductive layer is defined as a bit line.

2. The semiconductor device of claim 1, further comprising:
   a capacitor landing pad through the third isolation layer; and
   a bottom electrode plate, a high-k dielectric layer, and a top electrode plate in sequence over the capacitor landing pad, wherein the bottom electrode plate, the high-k dielectric layer, and the top electrode plate are defined as a capacitor.

3. The semiconductor device of claim 2, further comprising:
   a fourth isolation layer on the conductive layer, and the capacitor landing pad through the third isolation layer and the fourth isolation layer.

4. The semiconductor device of claim 3, further comprising:
   a fifth isolation layer on the fourth isolation layer and the capacitor landing pad.

5. The semiconductor device of claim 4, wherein the bottom electrode plate, the high-k dielectric layer, and the top electrode plate are formed embedded in the fifth isolation layer, and the capacitor is over the conductive layer.

6. The semiconductor device of claim 2, wherein a vertical projection region of the bit line via contact on the substrate is not overlapped with a vertical projection region of the capacitor landing pad on the substrate.

7. The semiconductor device of claim 2, wherein the bottom electrode plate wraps around the high-k dielectric layer, and wherein the high-k dielectric layer wraps around the top electrode plate.

8. The semiconductor device of claim 2, wherein the bottom electrode plate is in contact with the capacitor landing pad.

9. The semiconductor device of claim 1, comprising:
   a polysilicon structure and a block structure on the substrate, and the polysilicon structure wrapping the block structure.

10. The semiconductor device of claim 2, wherein the bottom electrode plate, the high-k dielectric layer, the top electrode plate, the capacitor landing pad, a source terminal contact, a drain terminal contact, and the main body are defined as a DRAM cell, and an area density of the DRAM cell is less than six times a square of a feature size, per cell, and wherein the drain terminal contact and the source terminal contact are respectively disposed on sidewalls of the first polysilicon layer and the second polysilicon layer.

11. The semiconductor device of claim 1, wherein the second isolation layer has a strip shape, and wherein the main body of the memory device is arranged antisymmetrically, in the top view.

12. The semiconductor device of claim 1, wherein the third polysilicon layer covers the first polysilicon layer and the second polysilicon layer, and wherein the concave portion of the third polysilicon layer has a semi-elliptical profile, in the top view.

* * * * *